(12) United States Patent
Du et al.

(10) Patent No.: US 11,545,070 B2
(45) Date of Patent: Jan. 3, 2023

(54) SHIFT REGISTER UNIT, METHOD FOR DRIVING THE SAME, GATE DRIVE CIRCUIT, ARRAY SUBSTRATE AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Huakun Du, Beijing (CN); Peng Chen, Beijing (CN); Jingpeng Wang, Beijing (CN); Jianjian Chen, Beijing (CN); Yidian Zhang, Beijing (CN)

(73) Assignees: HEFEI XINSHENG OPTOELECTRONICS TECHNOLOGY CO., LTD., Anhui (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 0 days.

(21) Appl. No.: 17/412,148

(22) Filed: Aug. 25, 2021

(65) Prior Publication Data

US 2022/0076608 A1 Mar. 10, 2022

(30) Foreign Application Priority Data

Sep. 7, 2020 (CN) .......................... 202010928850.3

(51) Int. Cl.
G09G 5/00 (2006.01)
G09G 3/20 (2006.01)
G11C 19/28 (2006.01)

(52) U.S. Cl.
CPC ............. *G09G 3/2092* (2013.01); *G09G 3/20* (2013.01); *G09G 2300/0408* (2013.01); *G09G 2310/0286* (2013.01); *G09G 2310/061* (2013.01); *G11C 19/28* (2013.01)

(58) Field of Classification Search
CPC ................... G09G 3/20; G09G 3/2092; G09G 2300/0408; G09G 2310/0286; G09G 2310/061; G11C 19/28
See application file for complete search history.

(56) References Cited

U.S. PATENT DOCUMENTS

| | | | | |
|---|---|---|---|---|
| 2017/0270851 A1* | 9/2017 | Shang | ................... | G09G 3/2092 |
| 2019/0221163 A1* | 7/2019 | Xue | ..................... | G09G 3/3677 |
| 2021/0335175 A1* | 10/2021 | Mi | ........................... | G09G 3/20 |

FOREIGN PATENT DOCUMENTS

| | | | | | |
|---|---|---|---|---|---|
| CN | 107527587 A | * | 12/2017 | ................ | G09G 3/20 |
| KR | 2016043175 A | * | 4/2016 | ................ | G09G 3/20 |

* cited by examiner

*Primary Examiner* — Adam J Snyder
(74) *Attorney, Agent, or Firm* — IPro, PLLC

(57) ABSTRACT

A shift register unit includes a signal input module, a first control module, a second control module, a signal output module and a total reset module. The total reset module is configured to control a potential of the pull-up node and a potential of the signal output terminal based on a potential of a first pull-down node, a potential of a second pull-down node and a level signal.

19 Claims, 14 Drawing Sheets

In a first period, controlling, by the signal input module, the potential of the pull-up node to be the first potential based on the input signal, to charge the pull-up node; controlling, by the first control module, the potential of the first pull-down node to be the second potential based on the first control signal, the potential of the pull-up node and the level signal; and controlling, by the second control module, the potential of the second pull-down node to be the second potential based on the second control signal, the potential of the pull-up node and the level signal, wherein the potential of the input signal and the potential of the second control signal are the first potential, and the potential of the first control signal is the second potential — S201

In a second period, outputting, by the signal output module, an output signal at the first potential to the signal output terminal based on the potential of the pull-up node and the third control signal; controlling, by the first control module, the potential of the first pull-down node to be the second potential based on the first control signal, the potential of the pull-up node and the level signal; and controlling, by the second control module, the potential of the second pull-down node to be the second potential based on the second control signal, the potential of the pull-up node and the level signal, wherein the potential of the second control signal, the potential of the pull-up node and the potential of the third control signal are the first potential, and both the potential of the first control signal and the potential of the input signal are the second potential — S202

In a third period, controlling, by the first control module, the potential of the first pull-down node to be the first potential based on the first control signal, the potential of the pull-up node and the level signal; controlling, by the second control module, the potential of the second pull-down node to be the first potential based on the second control signal, the potential of the pull-up node and the level signal; and controlling, by the total reset module, both the potential of the pull-up node and potential of the signal output terminal to be the second potential based on the potential of the first pull-up node, the potential of the second pull-down node and the level signal, wherein the potential of the input signal, the potential of the third control signal and the potential of the pull-up node are the second potential, and both the potential of the first control signal and potential of the second control signal are the first potential — S203

FIG. 9

In a first period, controlling, by the signal input module, the potential of the pull-up node to be the first potential based on the input signal, to charge the pull-up node; controlling, by the first control module, the potential of the first pull-down node to be the second potential based on the first control signal, the potential of the pull-up node and the level signal; and controlling, by the second control module, the potential of the second pull-down node to be the second potential based on the second control signal, the potential of the pull-up node and the level signal, wherein the potential of the input signal and the potential of the second control signal are the first potential, and the potential of the first control signal is the second potential — S201

In a second period, outputting, by the signal output module, an output signal at the first potential to the signal output terminal based on the potential of the pull-up node and the third control signal; controlling, by the first control module, the potential of the first pull-down node to be the second potential based on the first control signal, the potential of the pull-up node and the level signal; and controlling, by the second control module, the potential of the second pull-down node to be the second potential based on the second control signal, the potential of the pull-up node and the level signal, wherein the potential of the second control signal, the potential of the pull-up node and the potential of the third control signal are the first potential, and both the potential of the first control signal and the potential of the input signal are the second potential — S202

In a fifth period, controlling, by the first control module, the potential of the first pull-down node to be the second potential based on the first control signal, the potential of the pull-up node and the level signal; controlling, by the second control module, the potential of the second pull-down node to be the first potential based on the second control signal, the potential of the pull-up node and the level signal; controlling, by the first noise reduction module, the potential of the pull-up node to be the second potential based on the potential of the first pull-down node, the potential of the second pull-down node and the level signal; controlling, by the second noise reduction module, the potential of the signal output terminal to be the second potential based on the potential of the first pull-down node, the potential of the second pull-down node and the level signal; and controlling, by the frame reset module, the potential of the pull-up node and the potential of the signal output terminal to be the second potential based on the frame reset signal and the level signal, wherein the potential of the input signal, the potential of the third control signal, the potential of the pull-up node and the potential of the first control signal are the second potential, and the potential of the frame reset signal and the potential of the second control signal are the first potential — S205

In a sixth period, controlling, by the first control module, the potential of the first pull-down node to be the second potential based on the first control signal, the potential of the pull-up node and the level signal; controlling, by the second control module, the potential of the second pull-down node to be the first potential based on the second control signal, the potential of the pull-up node and the level signal; controlling, by the first noise reduction module, the potential of the pull-up node to be the second potential based on the potential of the first pull-down node, the potential of the second pull-down node and the level signal; controlling, by and the second noise reduction module, the potential of the signal output terminal to be the second potential based on the potential of the first pull-down node, the potential of the second pull-down node and the level signal, wherein the potential of the input signal, the potential of the third control signal, the potential of the pull-up node and the potential of the first control signal are the second potential, and the potential of the second control signal is the first potential — S206

In a third period, controlling, by the first control module, the potential of the first pull-down node to be the first potential based on the first control signal, the potential of the pull-up node and the level signal; controlling, by the second control module, the potential of the second pull-down node to be the first potential based on the second control signal, the potential of the pull-up node and the level signal; and controlling, by the total reset module, both the potential of the pull-up node and potential of the signal output terminal to be the second potential based on the potential of the first pull-up node, the potential of the second pull-down node and the level signal, wherein the potential of the input signal, the potential of the third control signal and the potential of the pull-up node are the second potential, and both the potential of the first control signal and potential of the second control signal are the first potential — S203

In a fourth period, controlling, by the first control module, the potential of the first pull-down node to be the first potential based on the first control signal, the potential of the pull-up node and the level signal; and controlling, by the second control module, the potential of the second pull-down node to be the second potential based on the second control signal, the potential of the pull-up node and the level signal, wherein the potential of the input signal, the potential of the third control signal, the potential of the pull-up node and the potential of the second control signal are the second potential, and the potential of the first control signal is the first potential — S204

FIG. 10

SHIFT REGISTER UNIT, METHOD FOR DRIVING THE SAME, GATE DRIVE CIRCUIT, ARRAY SUBSTRATE AND DISPLAY DEVICE

CROSS-REFERENCE TO RELATED APPLICATION

This application claims priority to Chinese Patent Application No. 202010928850.3, filed on Sep. 7, 2020 and entitled "SHIFT REGISTER UNIT, METHOD FOR DRIVING SAME, GATE DRIVE CIRCUIT AND DISPLAY DEVICE", the disclosure of which is herein incorporated by reference in its entirety.

TECHNICAL FIELD

The present disclosure relates to the field of display technologies, and in particular to a shift register unit, a method for driving the same, a gate drive circuit, and a display device.

BACKGROUND

In the gate driver on array (GOA) technology, a gate drive circuit is integrated in an array substrate to replace a gate driver chip, thereby reducing power consumption and costs. Compared with the traditional technology, in the GOA technology, not only the circuit board bearing a gate driver can be omitted to realize a design in which two sides of a display panel are symmetric, but also the chip bonding area at the edge of the display panel can be omitted to facilitate a narrow-frame design. In addition, the chip bonding process in the row direction can be omitted in the GOA technology, which facilitates improvement in the overall productivity and yield.

A GOA structure is a gate drive circuit made of several thin film transistors (TFT) and a capacitor on an array substrate. In essence, the GOA structure is a shift register, which can turn on and reset signals line by line by repeatedly cascading shift register units.

SUMMARY

One or more embodiments of the present disclosure provide a shift register unit. The shift register unit includes: a signal input module, configured to charge a pull-up node based on an input signal; a first control module, configured to control a potential of a first pull-down node based on a first control signal, a potential of the pull-up node and a level signal; a second control module, configured to control a potential of a second pull-down node based on a second control signal, the potential of the pull-up node and the level signal; a signal output module, configured to output an output signal to a signal output terminal based on the potential of the pull-up node and a third control signal; and a total reset module, configured to control the potential of the pull-up node and a potential of the signal output terminal based on the potential of the first pull-down node, the potential of the second pull-down node and the level signal, wherein in a scanning period, a potential of the first control signal or a potential of the second control signal is an operating potential; and in at least part of a blanking period, both the potential of the first control signal and the potential of the second control signal are the operating potential.

Optionally, the total reset module includes a first transistor, a second transistor, a third transistor and a fourth transistor, wherein a gate of the first transistor is coupled with the first pull-down node, a first electrode of the first transistor is coupled with the second pull-down node, and a second electrode of the first transistor is coupled with a gate of the third transistor; a first electrode of the third transistor is coupled with the signal output terminal, and a second electrode of the third transistor is configured to receive the level signal; and a gate of the second transistor is coupled with the second pull-down node, a first electrode of the second transistor is coupled with the first pull-down node, and a second electrode of the second transistor is coupled with a gate of the fourth transistor; a first electrode of the fourth transistor is coupled with the pull-up node, and a second electrode of the fourth transistor is configured to receive the level signal.

Optionally, the total reset module further includes a fifth transistor and a sixth transistor, wherein a gate of the fifth transistor is coupled with the second electrode of the first transistor, a first electrode of the fifth transistor is coupled with the pull-up node, and a second electrode of the fifth transistor is configured to receive the level signal; and a gate of the sixth transistor is coupled with the second electrode of the second transistor, a first electrode of the sixth transistor is coupled with the signal output terminal, and a second electrode of the sixth transistor is configured to receive the level signal.

Optionally, the first control module includes a seventh transistor, an eighth transistor, an eleventh transistor and a twelfth transistor, wherein a gate and a first electrode of the seventh transistor are configured to receive the first control signal, and a second electrode of the seventh transistor is coupled with a first electrode of the twelfth transistor; a gate of the twelfth transistor is coupled with the pull-up node, and a second electrode of the twelfth transistor is configured to receive the level signal; a gate of the eighth transistor is coupled with the second electrode of the seventh transistor, a first electrode of the eighth transistor is configured to receive the first control signal, and a second electrode of the eighth transistor is coupled with the first pull-down node; and a gate of the eleventh transistor is coupled with the pull-up node, a first electrode of the eleventh transistor is coupled with the first pull-down node, and a second electrode of the eleventh transistor is configured to receive the level signal.

Optionally, the second control module includes a ninth transistor, a tenth transistor, a thirteenth transistor and a fourteenth transistor, wherein a gate and a first electrode of the ninth transistor are configured to receive the second control signal, and a second electrode of the ninth transistor is coupled with a first electrode of the thirteenth transistor; a gate of the thirteenth transistor is coupled with the pull-up node, and a second electrode of the thirteenth transistor is configured to receive the level signal; a gate of the tenth transistor is coupled with the second electrode of the ninth transistor, a first electrode of the tenth transistor is configured to receive the second control signal, and a second electrode of the tenth transistor is coupled with the second pull-down node; and a gate of the fourteenth transistor is coupled with the pull-up node, a first electrode of the fourteenth transistor is coupled with the second pull-down node, and a second electrode of the fourteenth transistor is configured to receive the level signal.

Optionally, the shift register unit further includes: a first noise reduction module, configured to control the potential of the pull-up node based on the potential of the first pull-down node, the potential of the second pull-down node and the level signal; and a second noise reduction module, configured to control the potential of the signal output terminal based on the potential of the first pull-down node, the potential of the second pull-down node and the level signal.

Optionally, the first noise reduction module includes a fifteenth transistor and a sixteenth transistor, wherein a gate of the fifteenth transistor is coupled with the second pull-down node, a first electrode of the fifteenth transistor is coupled with the pull-up node, and a second electrode of the fifteenth transistor is configured to receive the level signal; and a gate of the sixteenth transistor is coupled with the first pull-down node, a first electrode of the sixteenth transistor is coupled with the pull-up node, and a second electrode of the sixteenth transistor is configured to receive the level signal.

Optionally, the second noise reduction module includes a seventeenth transistor and an eighteenth transistor, wherein a gate of the seventeenth transistor is coupled with the first pull-down node, a first electrode of the seventeenth transistor is coupled with the signal output terminal, and a second electrode of the seventeenth transistor is configured to receive the level signal; and a gate of the eighteenth transistor is coupled with the second pull-down node, a first electrode of the eighteenth transistor is coupled with the signal output terminal, and a second electrode of the eighteenth transistor is configured to receive the level signal.

Optionally, the shift register unit further includes: a frame reset module, configured to control the potential of the pull-up node and the potential of the signal output terminal based on a frame reset signal and the level signal.

Optionally, the frame reset module includes a nineteenth transistor and a twentieth transistor, wherein a gate of the nineteenth transistor is configured to receive the frame reset signal, a first electrode of the nineteenth transistor is coupled with the pull-up node, and a second electrode of the nineteenth transistor is configured to receive the level signal; and a gate of the twentieth transistor is configured to receive the frame reset signal, a first electrode of the twentieth transistor is coupled with the signal output terminal, and a second electrode of the twentieth transistor is configured to receive the level signal.

Optionally, the signal input module includes a twenty-first transistor, wherein a gate and a first electrode of the twenty-first transistor are configured to receive the input signal, and a second electrode of the twenty-first transistor is coupled with the pull-up node.

Optionally, the signal output module includes a twenty-second transistor and a capacitor, wherein a gate of the twenty-second transistor is coupled with the pull-up node, a first electrode of the twenty-second transistor is configured to receive the third control signal, and a second electrode of the twenty-second transistor is coupled with the signal output terminal; and one terminal of the capacitor is coupled with the pull-up node, and the other terminal of the capacitor is coupled with the second electrode of the twenty-second transistor.

Optionally, each transistor in the shift register unit comprises at least one of a polysilicon thin film transistor, an amorphous-silicon thin film transistor, an oxide thin film transistor and an organic thin film transistor.

One or more embodiments of the present disclosure provide a method for driving a shift register unit. The method is applicable to drive a shift register unit, wherein the shift register unit comprises a signal input module, a first control module, a second control module, a signal output module and a total reset module. The method includes: in a first period, controlling, by the signal input module, a potential of a pull-up node to be a first potential based on an input signal, to charge the pull-up node; controlling, by the first control module, a potential of a first pull-down node to be a second potential based on a first control signal, the potential of the pull-up node and a level signal; controlling, by the second control module, a potential of a second pull-down node to be the second potential based on a second control signal, the potential of the pull-up node and the level signal, wherein a potential of the input signal and a potential of the second control signal are the first potential, a potential of the first control signal is the second potential, and a potential of the level signal is the second potential, the first potential being an operating potential, and the second potential being a non-operating potential; and in a second period, outputting, by the signal output module, an output signal at the first potential to a signal output terminal based on the potential of the pull-up node and a third control signal; controlling, by the first control module, the potential of the first pull-down node to be the second potential based on the first control signal, the potential of the pull-up node and the level signal; and controlling, by the second control module, the potential of the second pull-down node to be the second potential based on the second control signal, the potential of the pull-up node and the level signal, wherein the potential of the second control signal, the potential of the pull-up node and a potential of the third control signal are the first potential, and the potential of the first control signal and the potential of the input signal are the second potential; and in a third period, controlling, by the first control module, the potential of the first pull-down node to be the first potential based on the first control signal, the potential of the pull-up node and the level signal; controlling, by the second control module, the potential of the second pull-down node to be the first potential based on the second control signal, the potential of the pull-up node and the level signal; and controlling, by the total reset module, the potential of the pull-up node and a potential of the signal output terminal to be the second potential based on the potential of the first pull-up node, the potential of the second pull-down node and the level signal, wherein the potential of the input signal, the potential of the third control signal and the potential of the pull-up node are the second potential, and the potential of the first control signal and the potential of the second control signal are the first potential, wherein both the first period and the second period are within a scanning period, and the third period is within a blanking period.

Optionally, after the third period, the method further includes: in a fourth period, controlling, by the first control module, the potential of the first pull-down node to be the first potential based on the first control signal, the potential of the pull-up node and the level signal; and controlling, by the second control module, the potential of the second pull-down node to be the second potential based on the second control signal, the potential of the pull-up node and the level signal, wherein the potential of the input signal, the potential of the third control signal, the potential of the pull-up node and the potential of the second control signal are the second potential, and the potential of the first control signal is the first potential, wherein the fourth period is within the blanking period.

Optionally, the shift register unit further includes a frame reset module, a first noise reduction module and a second noise reduction module; and between the second period and the third period, the method further comprises: in a fifth period, controlling, by the first control module, the potential of the first pull-down node to be the second potential based on the first control signal, the potential of the pull-up node and the level signal; controlling, by the second control module, the potential of the second pull-down node to be the first potential based on the second control signal, the potential of the pull-up node and the level signal; controlling, by the first noise reduction module, the potential of the pull-up node to be the second potential based on the potential of the first pull-down node, the potential of the second pull-down node and the level signal; controlling, by the second noise reduction module, the potential of the signal output terminal to be the second potential based on the potential of the first pull-down node, the potential of the second pull-down node and the level signal; and controlling, by the frame reset module, both the potential of the pull-up node and the potential of the signal output terminal to be the second potential based on a frame reset signal and the level signal, wherein the potential of the input signal, the potential of the third control signal, the potential of the pull-up node and the potential of the first control signal are all the second potential, and a potential of the frame reset signal and the potential of the second control signal are the first potential; and in a sixth period, controlling, by the first control module, the potential of the first pull-down node to be the second potential based on the first control signal, the potential of the pull-up node and the level signal; controlling, by the second control module, the potential of the second pull-down node to be the first potential based on the second control signal, the potential of the pull-up node and the level signal; controlling, by the first noise reduction module, the potential of the pull-up node to be the second potential based on the potential of the first pull-down node, the potential of the second pull-down node and the level signal; and controlling, by the second noise reduction module, the potential of the signal output terminal to be the second potential based on the potential of the first pull-down node, the potential of the second pull-down node and the level signal, wherein the potential of the input signal, the potential of the third control signal, the potential of the pull-up node and the potential of the first control signal are the second potential, and the potential of the second control signal is the first potential, wherein the fifth period and the sixth period are within the scanning period.

One or more embodiments of the present disclosure provide a gate drive circuit. The gate drive circuit includes a signal input module, a first control module, a second control module, a signal output module and a total reset module, wherein an $N^{th}$ stage of shift register unit is configured to receive an input signal output from a signal output terminal of an $(N-k)^{th}$ stage of shift register unit, and the $N^{th}$ stage of shift register unit is configured to receive a frame reset signal output from a signal output terminal of an $(N+k)^{th}$ stage of shift register unit, wherein N is a number of the shift register units in the gate drive circuit, and k is an integer less than or equal to N.

One or more embodiments of the present disclosure provide an array substrate. The array substrate includes a base substrate and the gate drive circuit in the foregoing aspect. The base substrate is provided with a plurality of pixels, the gate drive circuit is coupled with the plurality of pixels, and the gate drive circuit is configured to provide a gate drive signal to the plurality of pixels.

One or more embodiments of the present disclosure provide a display device. The display device includes a power supply component and the array substrate in the foregoing aspect. The power supply component is coupled with the array substrate, and the power supply component is configured to supply power to the array substrate.

BRIEF DESCRIPTION OF THE DRAWINGS

For clearer descriptions of the technical solutions in one or more embodiments of the present disclosure, the following briefly describes the accompanying drawings required for describing the embodiments or the prior art. Apparently, the accompanying drawings in the following description show merely one or more embodiments of the present disclosure, and those of ordinary skill in the art can still derive other drawings from these accompanying drawings without creative efforts.

FIG. 9 is a flowchart of a method for driving a shift register unit according to one or more embodiments of the present disclosure;

FIG. 10 is a flowchart of a method for driving a shift register unit according to one or more embodiments of the present disclosure;

DETAILED DESCRIPTION

In order to make the objectives, technical solutions, and advantages of the present disclosure clearer, the following further describes the present disclosure in detail with reference to specific embodiments and the accompanying drawings.

It should be noted that the technical and scientific terms used in one or more embodiments of the present disclosure should have the same meanings as commonly understood by those of ordinary skill in the art of the present disclosure, unless otherwise defined. Words "first", "second", and the like used in one or more embodiments of the present disclosure are merely used to distinguish different parts, instead of indicating any particular order, quantity, or importance. Words "include", "comprise", and the like indicate that the element or article before the word covers elements, articles, or equivalents listed after the word, without precluding the possibility of covering other elements or articles. Words "couple", "connect", and the like are not limited to physical or mechanical coupling, and may include electrical connection, either direct or indirect. Words "on", "under", "left", "right", and the like are merely used to indicate relative location relationships. When the absolute location of a described object changes, its relative location relationship may also change accordingly. The term "and/or" used in one or more embodiments of the present disclosure indicates that there may be three relationships. For example, A and/or B may indicate that following three situations: only A exists, both A and B exist, and only B exists. In addition, the character "/" generally indicates that associated objects are in an "or" relationship.

In the prior art, signals are turned on and reset line by line, by repeatedly cascading shift register units. For conventional shift register units, the pull-up node PU and the signal output terminal Output in each shift register unit are reset through a total reset signal and by adding a single transistor, which mainly aims to discharge all shift register units at the end of scanning the last frame, to pull down the potential of the pull-up node PU and the potential of the signal output terminal Output. Therefore, abnormal picture display caused by charge residue and signal residue is avoided.

Figure 1:
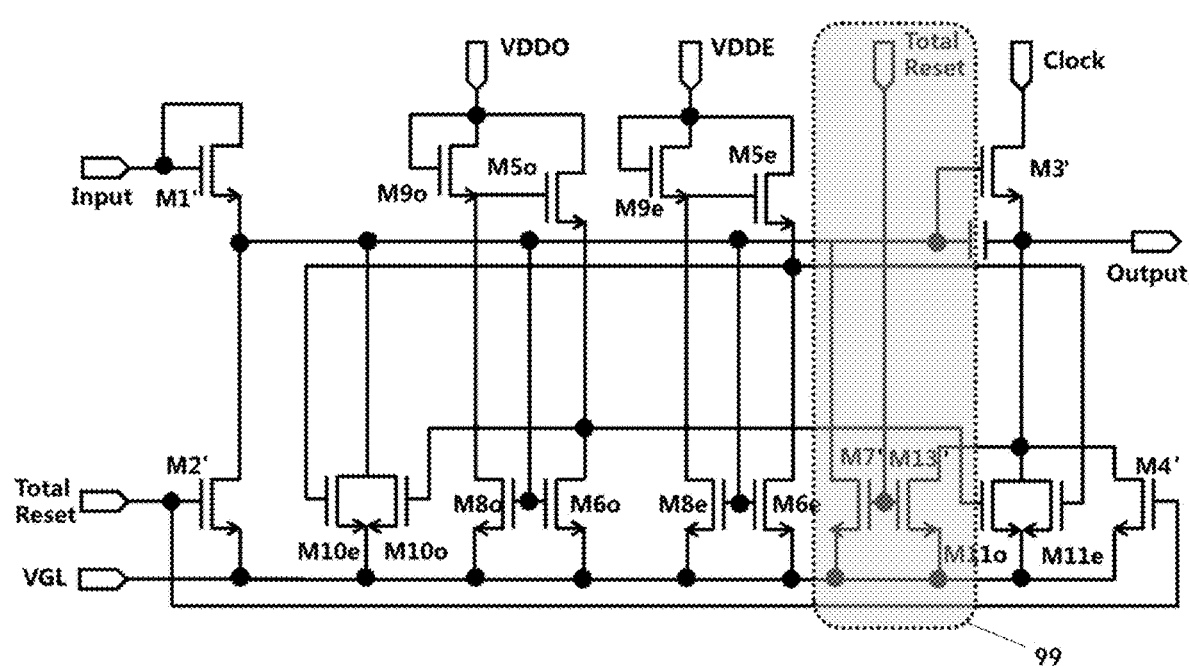
FIG. 1 is a schematic structural diagram of a circuit of a shift register unit in the prior art.

FIG. 1 is a schematic structural diagram of a circuit of a shift register unit which adopts double-VDD (VDDO and VDDE) noise reduction in the prior art. As shown in FIG. 1, in the prior art, the shift register unit includes a total reset unit 99. The total reset unit 99 includes a transistor M7' and a transistor M13'.

Both the gate of the transistor M7' and the gate of the transistor M13' are coupled with a total reset signal terminal (TRST). The source of the transistor M7' is coupled with the pull-up node PU, and the source of the transistor M13' is coupled with the signal output terminal Output. Both the drain of the transistor M7' and the drain of the transistor M13' are coupled with a level signal terminal VGL.

Figure 2:
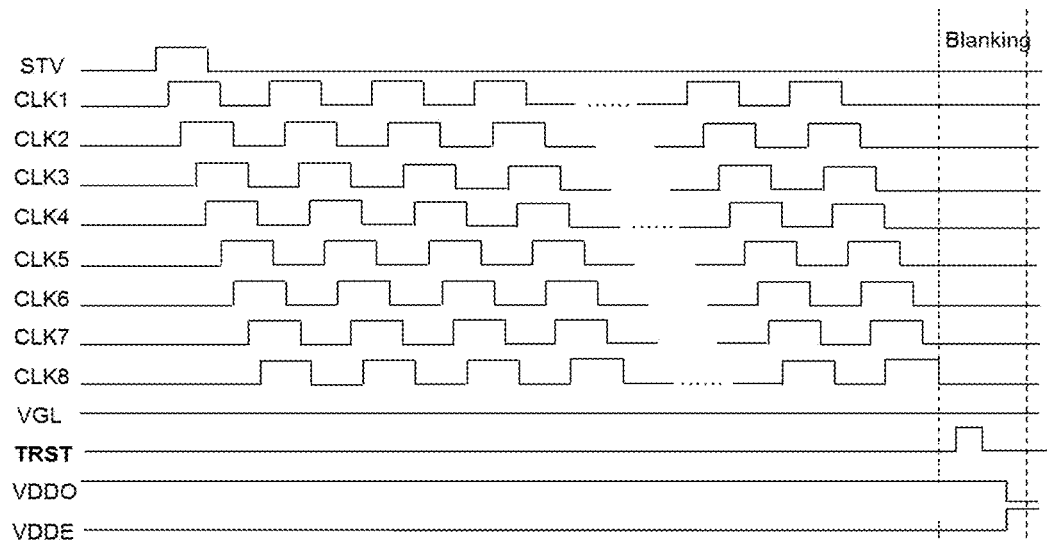
FIG. 2 is a schematic diagram of a timing sequence of a shift register unit in the prior art.

FIG. 2 is a diagram of a timing sequence of a gate drive circuit including the shift register unit shown in FIG. 1. By taking eight clock signals Clock as an example, one frame signal usually includes a scanning period and a blanking period. The blanking period is usually set at the end of the one frame signal, and a clock signal in the blanking period is set to be at a low potential. In the blanking period, signals in all columns are turned off. The TRST provides a total reset signal at a first potential. The transistor M7' and the transistor M13' are turned on. The level signal provided by the level signal terminal VGL is transmitted to the pull-up node PU through the turned-on transistor M7', and to the signal output terminal Output through the turned-on transistor M13', thereby resetting the pull-up node PU and the signal output terminal Output. Then, the level shift occurs between potentials of input signals of two VDDs, and noise reduction of the VDDs is achieved by alternate reversion between high and low levels. Therefore, the entire GOA unit is reset.

Optionally, the potential of the level signal may be a second potential. In addition, in the embodiments of the present disclosure, the first potential may be an operating potential (which may also be referred to as an effective potential), the second potential may be a non-operating potential (which may also be referred to as an ineffective potential), and the first potential may be a high potential relative to the second potential.

However, not all level shifts can provide a total reset signal in the blanking period, that is, some gate drive circuits may not provide a total reset signal. Under the circumstance of no total reset signal, at the end of each frame, if cascaded signals are not reset sufficiently, charge residue and signal residue may be caused. As a result, the GOA cannot be closed normally in this frame, and picture display in the next frame is affected.

Figure 3:
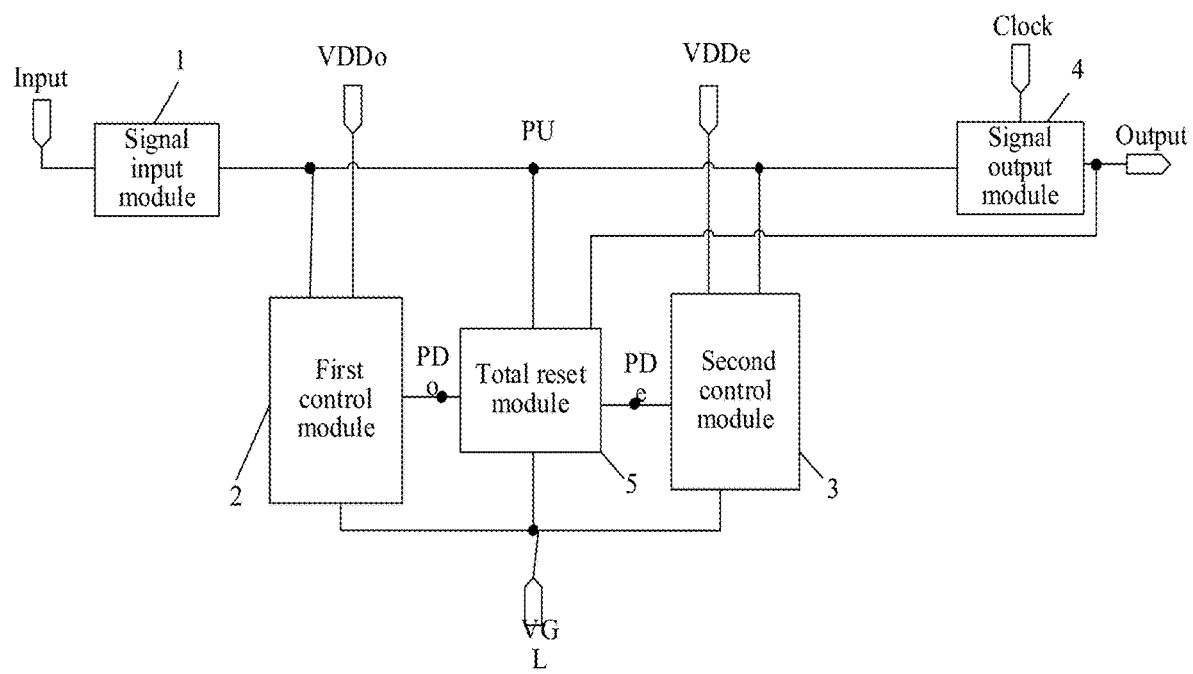
FIG. 3 is a schematic diagram of an equivalent circuit of a shift register unit according to one or more embodiments of the present disclosure.

For the above reasons, one or more embodiments of the present disclosure provide a shift register unit. As shown in FIG. 3, the shift register unit includes a signal input module 1, a first control module 2, a second control module 3, a signal output module 4 and a total reset module 5.

The signal input module 1 is configured to charge a pull-up node PU based on an input signal.

For example, as shown in FIG. 3, the signal input module 1 is coupled with a signal input terminal Input and the pull-up node PU. When providing an input signal, the signal input terminal Input can control the signal input module 1 to be turned on, to charge the pull-up node PU, thereby pulling up the potential of the pull-up node PU.

The first control module 2 is configured to control the potential of a first pull-down node PDo based on a first control signal, the potential of the pull-up node PU and a level signal.

For example, as shown in FIG. 3, the first control module 2 is coupled with a first control signal terminal VDDo, the pull-up node PU, a level signal terminal VGL and the first pull-down node PDo. The first control module 2 may control the potential of the first pull-down node PDo based on the first control signal provided by the first control signal terminal VDDo, the potential of the pull-up node PU and the level signal input by the level signal terminal VGL.

The second control module 3 is configured to control the potential of a second pull-down node PDe based on a second control signal, the potential of the pull-up node PU and the level signal.

For example, as shown in FIG. 3, the second control module 3 is coupled with a second control signal terminal VDDe, the pull-up node PU, the level signal terminal VGL and the second pull-down node PDe. The second control module 3 may control the potential of the second pull-down node PDe based on the second control signal input by the second control signal terminal VDDe, the potential of the pull-up node PU and the level signal input by the level signal terminal VGL.

The signal output module 4 is configured to output an output signal to a signal output terminal Output based on the potential of the pull-up node PU and a third control signal.

For example, as shown in FIG. 3, the signal output module 4 is coupled with the pull-up node PU, a third control signal terminal Clock and the signal output terminal Output. The signal output module 4 may generate an output signal based on the potential of the pull-up node PU and the third control signal input by the third control signal terminal Clock, and outputs the output signal to the signal output terminal Output.

The total reset module 5 is configured to control the potential of the pull-up node PU and the potential of the signal output terminal Output based on the potential of the first pull-down node PDo, the potential of the second pull-down node PDe and the level signal.

For example, as shown in FIG. 3, the total reset module 5 is coupled with the first pull-down node PDo, the second pull-down node PDe, the pull-up node PU, the level signal terminal VGL and the signal output terminal Output. The first control signal may affect the potential of the first pull-down node PDo, and the second control signal may affect the potential of the second pull-down node PDe. Therefore, in the total reset stage, the total reset module 5 may control the potential of the pull-up node PU and the potential of the signal output terminal Output based on the potential of the first pull-down node PDo, the potential of the second pull-down node PDe and the level signal input by the level signal terminal VGL, thereby pulling down and resetting of the pull-up node PU and the signal output terminal Output.

In the foregoing embodiment, in the scanning period of one frame signal, the potential of the first control signal or the potential of the second control signal is an operating potential, that is, one of the potential of the first control signal and the potential of the second control signal is the operating potential. That is, the first control signal terminal VDDo and the second control signal terminal VDDe output high potential and low potential alternatively. When the potential of the first control signal is a high potential (that is, a high level signal), the potential of the second control signal is a low potential (that is, a low level signal); and when the potential of the first control signal is a low potential, the potential of the second control signal is a high potential. Because only one of the potential of the first control signal and the potential of the second control signal is the operating potential in the scanning period, the total reset module 5 cannot be turned on. Therefore, the normal function of generating an output signal of the shift register unit is not affected.

In at least part of a blanking period of one frame signal, both the potential of the first control signal and the potential of the second control signal are the operating potential, such that total reset can be achieved by using the timing sequences of the first control signal and the second control signal which are both at the operating potential during potential alternation in the blanking period. In the blanking period, the total reset module 5 can only be turned on in the period when both the potential of the first control signal and the potential of the second control signal are the operating potential. When the total reset module 5 is turned on, the total reset of the entire shift register unit can be realized based on descriptions of the foregoing embodiment.

In summary, this embodiment of the present disclosure provides a shift register unit. In the shift register unit, the first control module can control the potential of the first pull-down node based on the first control signal. The second control module may control the potential of the second pull-down node based on the second control signal. The total reset module can reset the pull-up node and the output terminal under the control of the potential of the first pull-down node and the potential of the second pull-down node. Therefore, through flexible setting of the potential of the first control signal and the potential of the second control signal, the total reset module can reliably reset the pull-up node and the output terminal in the blanking stage, and the total reset module cannot reset the pull-up node and the output terminal in the scanning stage.

In addition, it can be learned from the descriptions of the foregoing embodiment, the shift register unit in this embodiment of the present disclosure has its own total reset function. That is, there is no need to dispose an additional total reset module in the circuit of the shift register unit to provide a total reset signal. Based on the circuit design of the shift register unit and signal timing adjustment, the total reset function of the circuit is achieved by using the timing sequences of the first control signal and the second control signal which are both at the operating potential during potential alternation in the blanking period of one frame signal. Total reset in each row can also be achieved in a GOA circuit which does not support a total reset signal during the level shift. Therefore, the impact of charge and signal residue in the last frame on output of the next frame is avoided, to avoid abnormal picture display.

Optionally, in the case that the shift register unit in the foregoing embodiment is applied to a GOA product (that is, a gate drive circuit), as the GOA product can implement the total reset function by itself, the GOA product is applicable to all level shifts, not matter whether a total reset signal exists in the level shift. Therefore, the limitation of IC selection is eliminated.

Figure 4:
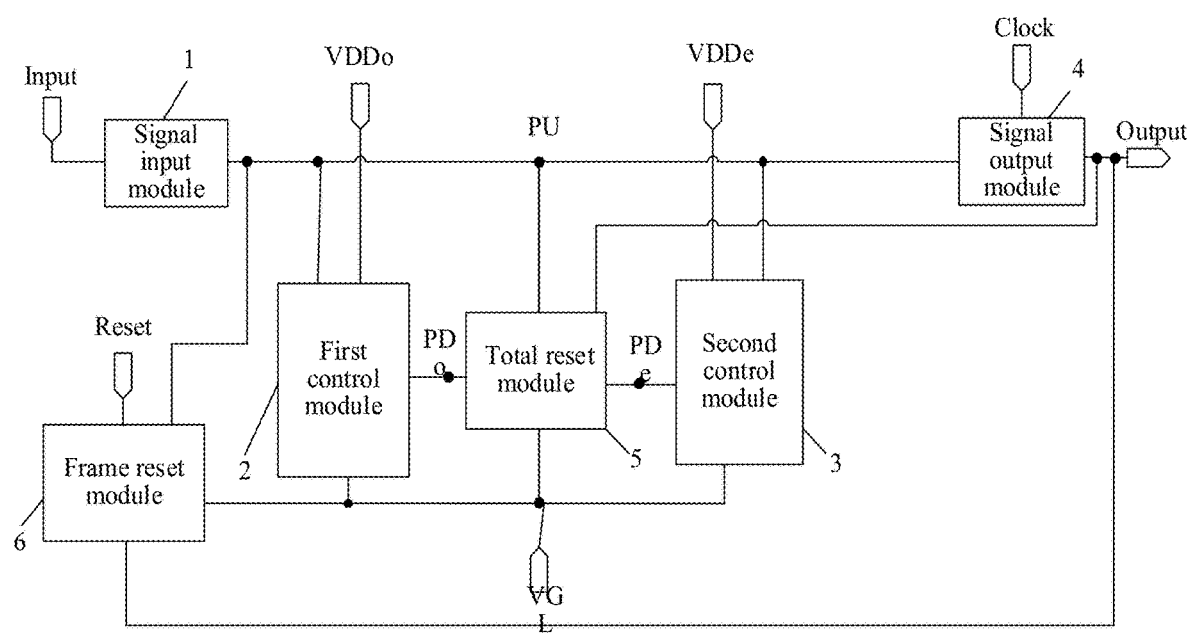
FIG. 4 is a schematic diagram of an equivalent circuit of a shift register unit according to one or more embodiments of the present disclosure.

Optionally, in one or more embodiments of the present disclosure, as shown in FIG. 4, the shift register unit further includes a frame reset module 6.

The frame reset module 6 may be configured to control the potential of the pull-up node PU and the potential of the signal output terminal Output based on a frame reset signal and the level signal.

For example, as shown in FIG. 4, the frame reset module 6 is coupled with a frame reset signal terminal Reset, the level signal terminal VGL, the pull-up node PU and the signal output terminal Output. When the potential of the frame reset signal input by the frame reset signal terminal Reset is the operating potential, the frame reset module 6 is turned on, such that the level signal at the second potential which is input by the level signal terminal VGL may be further transmitted to the pull-up node PU and the signal output terminal Output, so as to reset the pull-up node PU and the signal output terminal Output.

Figure 5:
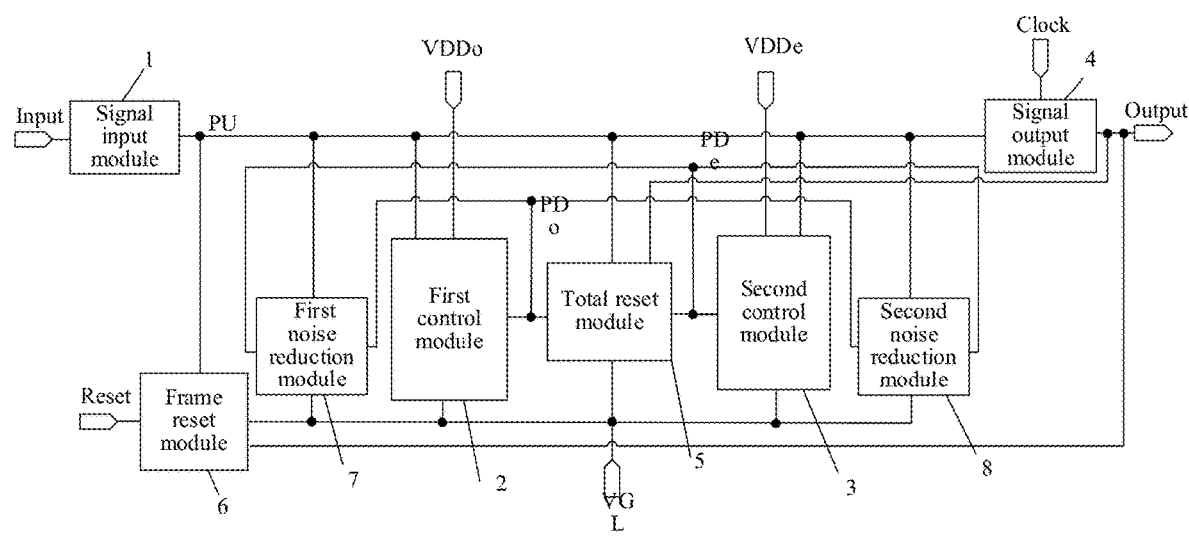
FIG. 5 is a schematic diagram of an equivalent circuit of a shift register unit according to one or more embodiments of the present disclosure.

Optionally, in one or more embodiments of the present disclosure, as shown in FIG. 5, the shift register unit may further include a first noise reduction module 7 and a second noise reduction module 8.

The first noise reduction module 7 may be configured to control the potential of the pull-up node PU based on the potential of the first pull-down node PDo, the potential of the second pull-down node PDe and the level signal.

For example, as shown in FIG. 5, the first noise reduction module 7 is coupled with the first pull-down node PDo, the second pull-down node PDe, the level signal terminal VGL and the pull-up node PU. When the potential of the first pull-down node PDo and/or the potential of the second pull-down node PDe are/is the first potential, the first noise reduction module 7 may be turned on, such that the level signal at the second potential which is input by the level signal terminal VGL may be further transmitted to the pull-up node PU, so as to reduce noise for the pull-up node PU.

The second noise reduction module 8 may be configured to control the potential of the output terminal of the signal output module 4 based on the potential of the first pull-down node PDo, the potential of the second pull-down node PDe and the level signal.

For example, as shown in FIG. 5, the second noise reduction module 8 is coupled with the first pull-down node PDo, the second pull-down node PDe, the level signal terminal VGL and the signal output terminal Output. When the potential of the first pull-down node PDo and/or the potential of the second pull-down node PDe are/is the first potential, the second noise reduction module 8 may be turned on, such that the level signal at the second potential which is input by the level signal terminal VGL may be further transmitted to the signal output terminal Output, so as to reduce noise for the signal output terminal Output.

Figure 6:
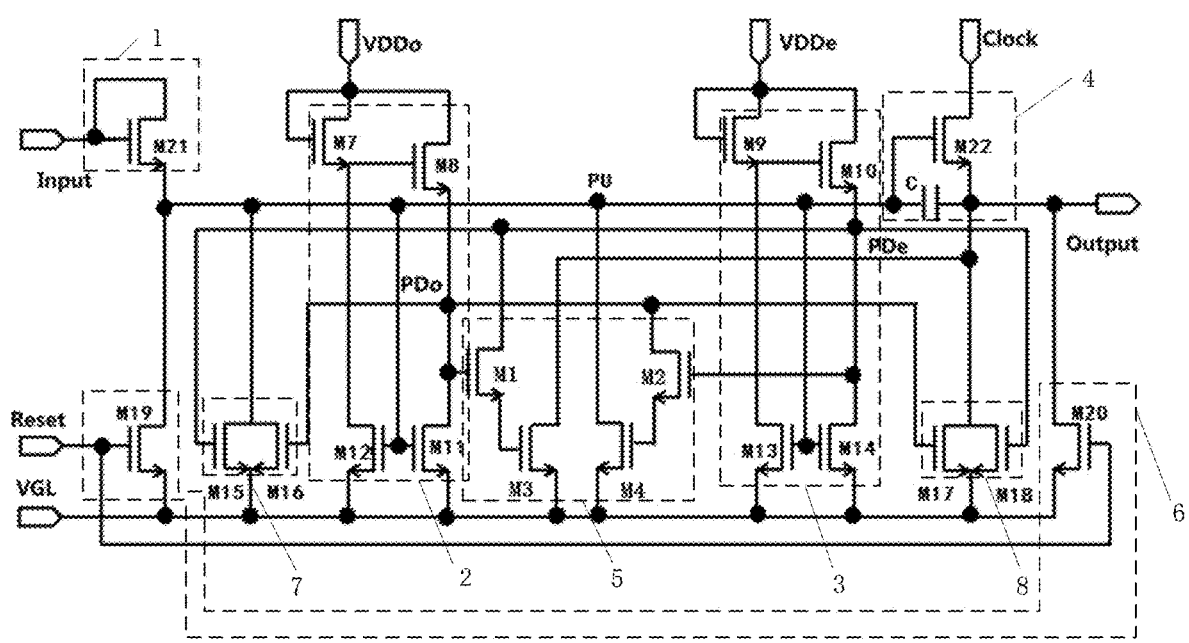
FIG. 6 is a schematic diagram of an equivalent circuit of the shift register unit according to one or more embodiments of the present disclosure.

In one or more embodiments of the present disclosure, as shown in FIG. 6, the total reset module 5 may include a first transistor M1, a second transistor M2, a third transistor M3 and a fourth transistor M4.

The gate of the first transistor M1 is coupled with the first pull-down node PDo, the first electrode of the first transistor M1 is coupled with the second pull-down node PDe, and the second electrode of the first transistor M1 is coupled with the gate of the third transistor M3. The first electrode of the third transistor M3 is coupled with the signal output terminal Output, and the second electrode of the third transistor M3 is coupled with the level signal terminal VGL, and configured to receive the level signal input by the level signal terminal VGL.

As shown in FIG. 4, as the gate of the first transistor M1 is coupled with the first pull-down node PDo, the first transistor M1 can be controlled to be turned on or turned off through the potential of the first pull-down node PDo. When the first transistor M1 is turned on, the gate of the third transistor M3 is coupled with the second pull-down node PDe. In this case, the third transistor M3 can be controlled to be turned on or turned off through the potential of the second pull-down node PDe. When the third transistor M3 is also turned on, the output terminal (that is, the signal output terminal Output) of the signal output module 4 is coupled with the level signal terminal VGL. In this case, the potential of the output terminal of the signal output module 4 can be controlled by the level signal output by the level signal terminal VGL, that is, the potential of the output signal output to the signal output terminal Output can be controlled. The signal output terminal Output can be discharged and the potential thereof can be pulled down through the level signal, to reset the signal output terminal Output.

The gate of the second transistor M2 is coupled with the second pull-down node PDe, the first electrode of the second transistor M2 is coupled with the first pull-down node PDo, and the second electrode of the second transistor M2 is coupled with the gate of the fourth transistor M4. The first electrode of the fourth transistor M4 is coupled with the pull-up node PU, and the second electrode of the fourth transistor M4 is coupled with the level signal terminal VGL, and configured to receive the level signal input by the level signal terminal VGL.

As shown in FIG. 4, as the gate of the second transistor M2 is coupled with the second pull-down node PDe, the second transistor M2 can be controlled to be turned on or turned off through the potential of the second pull-down node PDe. When the second transistor M2 is turned on, the gate of the fourth transistor M4 is coupled with the first pull-down node PDo. In this case, the fourth transistor M4 can be controlled to be turned on or turned off through the potential of the first pull-down node PDo. When the fourth transistor M4 is also turned on, the pull-up node PU is coupled with the level signal terminal VGL. In this case, the potential of the pull-up node PU can be controlled by the level signal output by the level signal terminal VGL. The pull-up node PU can be discharged and the potential thereof can be pulled down through the level signal, to reset the pull-up node PU.

In the foregoing embodiment, the first pull-down node PDo and the second pull-down node PDe can respectively control the first transistor M1 and the second transistor M2 to be turned on only when both the potential of the first control signal and the potential of the second control signal are the operating potential (that is, the first potential), to further control the third transistor M3 and the fourth transistor M4 to be turned on, thereby pulling down and discharging the pull-up node PU and the output terminal of the signal output module 4 to achieve the total reset function.

When only one of the potential of the first control signal and the potential of the second control signal is the operating potential, for example, the potential of the first control signal is the operating potential, the first pull-down node PDo can control the first transistor M1 to be turned on, and the gate of the third transistor M3 is coupled with the second pull-down node PDe. Because the potential of the second control signal is not the operating potential, the second pull-down node PDe cannot control the third transistor M3 to be turned on, that is, the second pull-down node PDe cannot control the potential of the output terminal of the signal output module 4. Accordingly, because the potential of the second control signal is not the operating potential, the second pull-down node PDe cannot control the second transistor M2 to be turned on, and cannot reset the pull-up node PU.

Therefore, in the scanning period of one frame signal, the total reset module 5 is not turned on, which does not affect the normal output of the entire shift register unit. The total reset function can be achieved only when both the potential of the first control signal and the potential of the second control signal are the operating potential during potential alternation in the blanking period. When the next one frame signal arrives, and when only one of the potential of the first control signal and the potential of the second control signal is the operating potential, the total reset module 5 is not turned on, which does not affect the normal output of the shift register unit.

It can be known from the foregoing embodiment that each row of shift register units can implement the total reset function in the blanking period of one frame, and the total reset module 5 is in a turn-off state, which guarantees the normal picture display. In addition, the total reset of the shift register unit can be achieved only through the first transistor M1, the second transistor M2, the third transistor M3 and the fourth transistor M4, which can reduce the power consumption of circuit and facilitate transistor layout (TFT layout).

Figure 7:
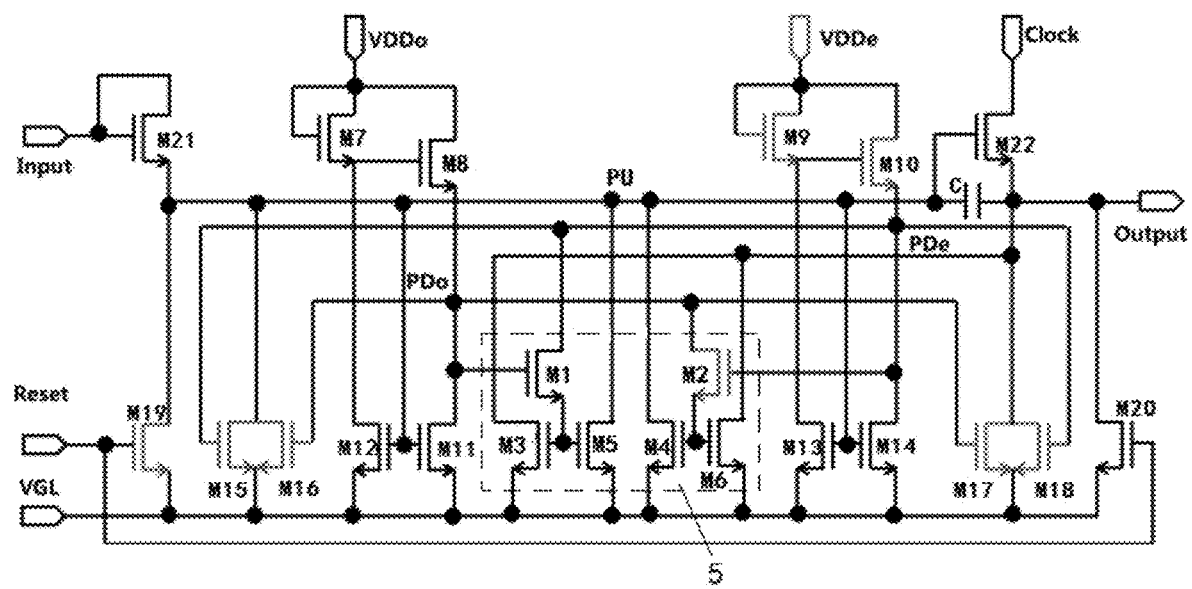
FIG. 7 is a schematic diagram of an equivalent circuit of the shift register unit according to one or more embodiments of the present disclosure.

In some optional embodiments of the present disclosure, as shown in FIG. 7, the total reset module 5 may further include a fifth transistor M5 and a sixth transistor M6.

The gate of the fifth transistor M5 is coupled with the second electrode of the first transistor M1, the first electrode of the fifth transistor M5 is coupled with the pull-up node PU, and the second electrode of the fifth transistor M5 is coupled with the level signal terminal VGL, and configured to receive the level signal input by the level signal terminal VGL.

As shown in FIG. 6, as the gate of the fifth transistor M5 is coupled with the second electrode of the first transistor M1, when the first transistor M1 is turned on, the gate of the fifth transistor M5 is coupled with the second pull-down node PDe. In this case, the fifth transistor M5 can be controlled to be turned on or turned off through the potential of the second pull-down node PDe. When the fifth transistor M5 is also turned on, the pull-up node PU is coupled with the level signal terminal VGL through the fifth transistor M5. In this case, the potential of the pull-up node PU can be controlled by the level signal output by the level signal terminal VGL. The pull-up node PU can be discharged and the potential thereof can be pulled down through the level signal, to reset the pull-up node PU.

The gate of the sixth transistor M6 is coupled with the second electrode of the second transistor M2, the first electrode of the sixth transistor M6 is coupled with the output terminal of the signal output module 4, and the second electrode of the sixth transistor M6 is coupled with the level signal terminal VGL, and configured to receive the level signal input by the level signal terminal VGL.

As shown in FIG. 6, as the gate of the sixth transistor M6 is coupled with the second electrode of the second transistor M2, when the second pull-down node PDe controls the second transistor M2 to be turned on, the gate of the sixth transistor M6 is coupled with the first pull-down node PDo. When the sixth transistor M6 is also turned on, the output terminal of the signal output module 4 is coupled with the level signal terminal VGL through the sixth transistor M6. In this case, the potential of the output terminal of the signal output module 4, that is, the potential of the output signal output to the signal output terminal Output, can be controlled through the level signal output by the level signal terminal VGL.

In the foregoing embodiment, the fifth transistor M5 and the sixth transistor M6 are additionally arranged, so that the potential of the pull-up node PU and the potential of the output terminal (that is, the signal output terminal Output) of the signal output module 4 can be pulled down, to obtain a better reset effect.

In some optional embodiments of the present disclosure, as shown in FIG. 6 and FIG. 7, the first control module 2 may include a seventh transistor M7, an eighth transistor M8, an eleventh transistor M11 and a twelfth transistor M12.

Both the gate and the first electrode of the seventh transistor M7 are coupled with the first control signal terminal VDDo, and configured to receive the first control signal input by the first control signal terminal VDDo, and the second electrode of the seventh transistor M7 is coupled with the first electrode of the twelfth transistor M12. The gate of the twelfth transistor M12 is coupled with the pull-up node PU, and the second electrode of the twelfth transistor M12 is coupled with the level signal terminal VGL, and configured to receive the level signal input by the level signal terminal VGL. It can be known that the seventh transistor M7 can be controlled to be turned on or turned off through the potential of the first control signal, and the twelfth transistor M12 can be controlled to be turned on or turned off through the potential of the pull-up node PU.

The gate of the eighth transistor M8 is coupled with the second electrode of the seventh transistor M7, the first electrode of the eighth transistor M8 is coupled with the first control signal terminal VDDo, and configured to receive the first control signal input by the first control signal terminal VDDo, and the second electrode of the eighth transistor M8 is coupled with the first pull-down node PDo.

Because the gate of the eighth transistor M8 is coupled with the second electrode of the seventh transistor M7, the eighth transistor M8 can be controlled to be turned on or turned off through the potential between the second electrode of the seventh transistor M7 and the first electrode of the twelfth transistor M12. When the seventh transistor M7 is turned on while the twelfth transistor M12 is turned off, the eighth transistor M8 is controlled to be turned on or turned off through the first control signal input by the first control signal terminal VDDo. When the seventh transistor M7 is turned off while the twelfth transistor M12 is turned on, the eighth transistor M8 is controlled to be turned on or turned off through the level signal input by the level signal terminal VGL. When both the seventh transistor M7 and the twelfth transistor M12 are turned on, the eighth transistor M8 is controlled to be turned on or turned off through the first control signal, the level signal, the seventh transistor M7 and the twelfth transistor M12 collectively. When the eighth transistor M8 is turned on, the first pull-down node PDo is coupled with the first control signal terminal VDDo through the eighth transistor M8.

The gate of the eleventh transistor M11 is coupled with the pull-up node PU, the first electrode of the eleventh transistor M11 is coupled with the first pull-down node PDo, and the second electrode of the eleventh transistor M11 is coupled with the level signal terminal VGL, and configured to receive the level signal input by the level signal terminal VGL. It can be known that the eleventh transistor M11 can be controlled to be turned on or turned off through the potential of the pull-up node PU. When the eleventh transistor M11 is turned on, the first pull-down node PDo is coupled with the level signal terminal VGL through the eleventh transistor M11.

In this embodiment of the present disclosure, the seventh transistor M7, the eighth transistor M8, the eleventh transistor M11 and the twelfth transistor M12 can be separately controlled to be turned on or turned off through the first control signal, the potential of the pull-up node PU and the level signal, thereby controlling the potential of the first pull-down node PDo.

In some optional embodiments of the present disclosure, as shown in FIG. 6 and FIG. 7, the second control module 3 may include a ninth transistor M9, a tenth transistor M10, a thirteenth transistor M13 and a fourteenth transistor M14.

Both the gate and the first electrode of the ninth transistor M9 are coupled with the second control signal terminal VDDe, and configured to receive the second control signal input by the second control signal terminal VDDe. The second electrode of the ninth transistor M9 is coupled with the first electrode of the thirteenth transistor M13. The gate of the thirteenth transistor M13 is coupled with the pull-up node PU, and the second electrode of the thirteenth transistor M13 is coupled with the level signal terminal VGL, and configured to receive the level signal input by the level signal terminal VGL. It can be known that the ninth transistor M9 can be controlled to be turned on or turned off through the potential of the second control signal, and the thirteenth transistor M13 can be controlled to be turned on or turned off through the potential of the pull-up node PU.

The gate of the tenth transistor M10 is coupled with the second electrode of the ninth transistor M9, the first electrode of the tenth transistor M10 is coupled with the second control signal terminal VDDe, and configured to receive the second control signal input by the second control signal terminal VDDe, and the second electrode of the tenth transistor M10 is coupled with the second pull-down node PDe.

Because the gate of the tenth transistor M10 is coupled with the second electrode of the ninth transistor M9, the tenth transistor M10 can be controlled to be turned on or turned off through the potential between the second electrode of the ninth transistor M9 and the first electrode of the thirteenth transistor M13. When the ninth transistor M9 is turned on while the thirteenth transistor M13 is turned off, the tenth transistor M10 is controlled to be turned on or turned off through the second control signal input by the second control signal terminal VDDe. When the ninth transistor M9 is turned off while the thirteenth transistor M13 is turned on, the tenth transistor M10 is controlled to be turned on or turned off through the level signal input by the level signal terminal VGL. When both the ninth transistor M9 and the thirteenth transistor M13 are turned on, the tenth transistor M10 is controlled to be turned on or turned off through the second control signal, the level signal, the ninth transistor M9 and the thirteenth transistor M13 collectively. When the tenth transistor M10 is turned on, the second pull-down node PDe is coupled with the second control signal terminal VDDe through the tenth transistor M10.

The gate of the fourteenth transistor M14 is coupled with the pull-up node PU, the first electrode of the fourteenth transistor M14 is coupled with the second pull-down node PDe, and the second electrode of the fourteenth transistor M14 is coupled with the level signal terminal VGL, and configured to receive the level signal input by the level signal terminal VGL. It can be known that the fourteenth transistor M14 can be controlled to be turned on or turned off through the potential of the pull-up node PU. When the fourteenth transistor M14 is turned on, the second pull-down node PDe is coupled with the level signal terminal VGL through the fourteenth transistor M14.

In this embodiment of the present disclosure, the ninth transistor M9, the tenth transistor M10, the thirteenth transistor M13 and the fourteenth transistor M14 can be separately controlled to be turned on or turned off through the second control signal, the potential of the pull-up node PU and the level signal, thereby controlling the potential of the second pull-down node PDe.

In some optional embodiments of the present disclosure, as shown in FIG. 6 and FIG. 7, the first noise reduction module 7 includes a fifteenth transistor M15 and a sixteenth transistor M16, and the second noise reduction module 8 includes a seventeenth transistor M17 and an eighteenth transistor M18.

The gate of the fifteenth transistor M15 is coupled with the second pull-down node PDe, the first electrode of the fifteenth transistor M15 is coupled with the pull-up node PU, and the second electrode of the fifteenth transistor M15 is coupled with the level signal terminal VGL, and configured to receive the level signal input by the level signal terminal VGL. The gate of the sixteenth transistor M16 is coupled with the first pull-down node PDo, the first electrode of the sixteenth transistor M16 is coupled with the pull-up node PU, and the second electrode of the sixteenth transistor M16 is coupled with the level signal terminal VGL, and configured to receive the level signal input by the level signal terminal VGL.

In this embodiment of the present disclosure, because the gate of the fifteenth transistor M15 is coupled with the second pull-down node PDe, the fifteenth transistor M15 can be controlled to be turned on or turned off through the potential of the second pull-down node PDe. When the fifteenth transistor M15 is turned on, the pull-up node PU is coupled with the level signal terminal VGL through the fifteenth transistor M15. Because the gate of the sixteenth transistor M16 is coupled with the first pull-down node PDo, the sixteenth transistor M16 can be controlled to be turned on or turned off through the potential of the first pull-down node PDo. When the sixteenth transistor M16 is turned on, the pull-up node PU is coupled with the level signal terminal VGL through the sixteenth transistor M16. Therefore, the sixteenth transistor M16 and the fifteenth transistor M15 can be controlled to be turned on or turned off through the potential of the first pull-down node PDo and the potential of the second pull-down node PDe, respectively; and the potential of the pull-up node PU can be controlled based on the level signal.

It can also be known from FIG. 6 and FIG. 7 that the gate of the seventeenth transistor M17 is coupled with the first pull-down node PDo, the first electrode of the seventeenth transistor M17 is coupled with the output terminal of the signal output module 4, and the second electrode of the seventeenth transistor M17 is coupled with the level signal terminal VGL, and configured to receive the level signal input by the level signal terminal VGL. The gate of the eighteenth transistor M18 is coupled with the second pull-down node PDe, the first electrode of the eighteenth transistor M18 is coupled with the output terminal of the signal output module 4, and the second electrode of the eighteenth transistor M18 is coupled with the level signal terminal VGL, and configured to receive the level signal input by the level signal terminal VGL.

In this embodiment of the present disclosure, because the gate of the seventeenth transistor M17 is coupled with the first pull-down node PDo, the seventeenth transistor M17 can be controlled to be turned on or turned off through the potential of the first pull-down node PDo. When the seventeenth transistor M17 is turned on, the output terminal of the signal output module 4 is coupled with the level signal terminal VGL through the seventeenth transistor M17. Because the gate of the eighteenth transistor M18 is coupled with the second pull-down node PDe, the eighteenth transistor M18 can be controlled to be turned on or turned off through the potential of the second pull-down node PDe. When the eighteenth transistor M18 is turned on, the output terminal of the signal output module 4 is coupled with the level signal terminal VGL through the eighteenth transistor M18. Therefore, the seventeenth transistor M17 and the eighteenth transistor M18 can be controlled to be turned on or turned off based on the potential of the first pull-down node PDo and the potential of the second pull-down node PDe, respectively; and the potential of the output terminal of the signal output module 4 can be controlled based on the level signal, thereby controlling the output signal.

In some optional embodiments of the present disclosure, as shown in FIG. 6 and FIG. 7, the frame reset module 6 may include a nineteenth transistor M19 and a twentieth transistor M20.

The gate of the nineteenth transistor M19 is coupled with the frame reset signal terminal Reset, and configured to receive the frame reset signal input by the frame reset signal terminal Reset, the first electrode of the nineteenth transistor M19 is coupled with the pull-up node PU, and the second electrode of the nineteenth transistor M19 is coupled with the level signal terminal VGL.

Because the gate of the nineteenth transistor M19 is coupled with the frame reset signal terminal Reset, the nineteenth transistor M19 can be controlled to be turned on or turned off through the potential of the frame reset signal input by the frame reset signal terminal Reset. When the nineteenth transistor M19 is turned on, the pull-up node PU is coupled with the level signal terminal VGL through the nineteenth transistor M19. Therefore, the potential of the pull-up node PU can be controlled based on the frame reset signal and the level signal.

The gate of the twentieth transistor M20 is coupled with the frame reset signal terminal Reset, and configured to receive the frame reset signal input by the frame reset signal terminal Reset, the first electrode of the twentieth transistor M20 is coupled with the output terminal (that is, the signal output terminal Output) of the signal output module 4, and the second electrode of the twentieth transistor M20 is coupled with the level signal terminal VGL and is configured to receive the level signal provided by the level signal terminal VGL.

Because the gate of the twentieth transistor M20 is coupled with the frame reset signal terminal Reset, the twentieth transistor M20 can be controlled to be turned on or turned off through the potential of the frame reset signal input by the frame reset signal terminal Reset. When the twentieth transistor M20 is turned on, the output terminal of the signal output module 4 is coupled with the level signal terminal VGL through the twentieth transistor M20. Therefore, the potential of the signal output terminal Output can be controlled based on the frame reset signal and the level signal, thereby controlling the output signal.

In some optional embodiments of the present disclosure, as shown in FIG. 6 and FIG. 7, the signal input module 1 may include a twenty-first transistor M21.

Both the gate and the first electrode of the twenty-first transistor M21 are coupled with the signal input terminal Input, and configured to receive the input signal input by the signal input terminal Input, and the second electrode of the twenty-first transistor M21 is coupled with the pull-up node PU.

Because the gate of the twenty-first transistor M21 is coupled with the signal input terminal Input, the twenty-first transistor M21 can be controlled to be turned on or turned off based on the input signal input by the signal input terminal Input. When the twenty-first transistor M21 is turned on, the potential of the pull-up node PU can be pulled up based on the input signal.

In some optional embodiments of the present disclosure, as shown in FIG. 6 and FIG. 7, the signal output module 4 may include a twenty-second transistor M22 and a capacitor C.

The gate of the twenty-second transistor M22 is coupled with the pull-up node PU, the first electrode of the twenty-second transistor M22 is coupled with the third control signal terminal Clock, and configured to receive the third control signal input by the third control signal terminal Clock, and the second electrode of the twenty-second transistor M22 is coupled with the signal output terminal Output, and configured to output the output signal to the signal output terminal Output. One terminal of the capacitor C is coupled with the pull-up node PU, and the other terminal of the capacitor C is coupled with the second electrode of the twenty-second transistor M22.

Because the gate of the twenty-second transistor M22 is coupled with the pull-up node PU, the twenty-second transistor M22 can be controlled to be turned on or turned off through the potential of the pull-up node PU. When the twenty-second transistor M22 is turned on, the output signal can be generated based on the third control signal input by the third control signal terminal Clock, and output to the signal output terminal Output.

It should be noted that each of the transistors in the foregoing embodiments is one of a polysilicon thin film transistor, an amorphous-silicon thin film transistor, an oxide thin film transistor and an organic thin film transistor.

In the embodiments of the present disclosure, the "gate" may be a control electrode or a base electrode of a transistor, the "first electrode" may be a source or an emitter of the transistor, and accordingly the "second electrode" may be a drain or a collector of the transistor. Certainly, it's to be understood by those skilled in the art that the "first electrode" and the "second electrode" are interchangeable.

In addition, the level signal terminal VGL is a low-level signal input terminal, and the level signal is a low-level signal accordingly. The level signal may also be a high-level signal, if necessary. The third control signal may be a clock signal.

It should be noted that the foregoing embodiments are all described by taking an example in which the transistors are N-type transistors and the first potential is a high potential relative to the second potential. Certainly, the transistors may alternatively be P-type transistors. When the transistors are P-type transistors, and the first potential is a low potential relative to the second potential.

Figure 8:
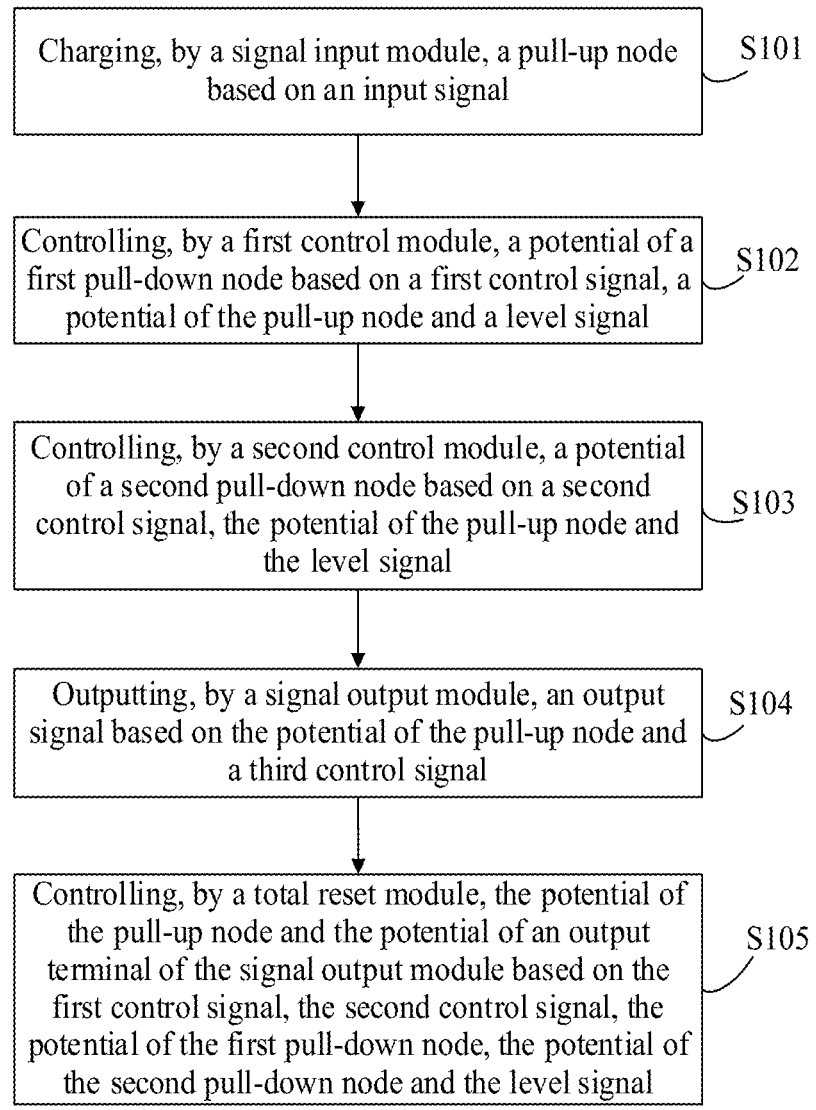
FIG. 8 is a flowchart of a method for driving a shift register unit according to one or more embodiments of the present disclosure.

One or more embodiments of the present disclosure further provide a method for driving a shift register unit. The method is applicable to drive the shift register unit in any one of the foregoing embodiments. As shown in FIG. 8, the method includes the following steps.

In step S101, the signal input module charges the pull-up node based on an input signal.

In step S102, the first control module controls the potential of the first pull-down node based on the first control signal, the potential of the pull-up node and the level signal.

In step S103, the second control module controls the potential of the second pull-down node based on the second control signal, the potential of the pull-up node and the level signal.

In step S104, the signal output module outputs an output signal based on the potential of the pull-up node and the third control signal.

In step S105, the total reset module controls the potential of the pull-up node and the potential of the output terminal of the signal output module based on the first control signal, the second control signal, the potential of the first pull-down node, the potential of the second pull-down node and the level signal.

In a scanning period, one of the first control signal and the second control signal is at an operating potential; and in at least part of a blanking period, both the first control signal and the second control signal are at the operating potential.

The method for driving a shift register unit in the present disclosure is further described below with reference to FIG. 9. Here, the level signal terminal VGL continuously inputs low-level signals, and the method may include the following steps.

In step S201, in a first period, the signal input module controls the potential of the pull-up node to be the first potential based on the input signal, to charge the pull-up node; the first control module controls the potential of the first pull-down node to be the second potential based on the first control signal, the potential of the pull-up node and the level signal; and the second control module controls the potential of the second pull-down node to be the second potential based on the second control signal, the potential of the pull-up node and the level signal, wherein the potential of the input signal and the potential of the second control signal are the first potential, and the potential of the first control signal is the second potential.

The potential of the level signal may be the second potential, and the first potential may be the operating potential. The second potential may be a non-operating potential, and the first potential may be a high potential relative to the second potential.

That is, in the first period, the potential of the input signal is a high potential, that is, the input signal is a high-level signal, the potential of the pull-up node is a high potential, the potential of the first control signal is a low potential, the potential of the first pull-down node is a low potential, the potential of the second control signal is a high potential, the potential of the second pull-down node is a low potential, the potential of the third control signal is a low potential, and the potential of the output signal is a low potential.

In step S202, in a second period, the signal output module outputs an output signal at the first potential to the signal output terminal based on the potential of the pull-up node and the third control signal; the first control module controls the potential of the first pull-down node to be the second potential based on the first control signal, the potential of the pull-up node and the level signal; and the second control module controls the potential of the second pull-down node to be the second potential based on the second control signal, the potential of the pull-up node and the level signal, wherein the potential of the second control signal, the potential of the pull-up node and the potential of the third control signal are the first potential, and both the potential of the first control signal and the potential of the input signal are the second potential.

That is, in the second period, the potential of the input signal is a low potential, that is, the input signal is a low-level signal, the potential of the pull-up node is a high potential, the potential of the first control signal is a low potential, the potential of the first pull-down node is a low potential, the potential of the second control signal is a high potential, the potential of the second pull-down node is a low potential, the potential of the third control signal is a high potential, that is, the third control signal is a high-level signal, and the potential of the output signal is a high potential, that is, the output signal is a high-level signal.

In step S203, in a third period, the first control module controls the potential of the first pull-down node to be the first potential based on the first control signal, the potential of the pull-up node and the level signal; the second control module controls the potential of the second pull-down node to be the first potential based on the second control signal, the potential of the pull-up node and the level signal; and the total reset module controls both the potential of the pull-up node and potential of the signal output terminal to be the second potential based on the potential of the first pull-up node, the potential of the second pull-down node and the level signal, wherein the potential of the input signal, the potential of the third control signal and the potential of the pull-up node are the second potential, and both the potential of the first control signal and potential of the second control signal are the first potential.

That is, in the third period, the potential of the input signal is a low potential, the potential of the first control signal is a high potential, the potential of the second control signal is a high potential, the potential of the first pull-down node is a high potential; and the potential of the second pull-down node is a high potential. The total reset module can be controlled, based on the potential of the first pull-down node and the potential of the second pull-down node, to pull down the potential of the pull-up node and the potential of the output terminal of the signal output module.

Both the first period and the second period may be within the scanning period; and the third period may be within the blanking period.

The method for driving a shift register unit in the present disclosure is described below with reference to FIG. 10. Here, the level signal terminal VGL continuously inputs low-level signals, and after the third period, that is, after step S203, the method may further include the following step.

In step S204, in a fourth period, the first control module controls the potential of the first pull-down node to be the first potential based on the first control signal, the potential of the pull-up node and the level signal; and the second control module controls the potential of the second pull-down node to be the second potential based on the second control signal, the potential of the pull-up node and the level signal, wherein the potential of the input signal, the potential of the third control signal, the potential of the pull-up node and the potential of the second control signal are the second potential, and the potential of the first control signal is the first potential.

That is, in the fourth period, the potential of the input signal is a low potential, the potential of the first control signal is a high potential, the potential of the second control signal is a low potential, the potential of the pull-up node PU is a low potential, the potential of the first pull-down node is a high potential, and the potential of the second pull-down node is a low potential.

In addition, referring to FIG. 10, between the second period and the third period, that is, between step S202 and step S203, the method may further include the following steps.

In step S205, in a fifth period, the first control module controls the potential of the first pull-down node to be the second potential based on the first control signal, the potential of the pull-up node and the level signal; the second control module controls the potential of the second pull-down node to be the first potential based on the second control signal, the potential of the pull-up node and the level signal; the first noise reduction module controls the potential of the pull-up node to be the second potential based on the potential of the first pull-down node, the potential of the second pull-down node and the level signal; the second noise reduction module controls the potential of the signal output terminal to be the second potential based on the potential of the first pull-down node, the potential of the second pull-down node and the level signal; and the frame reset module controls the potential of the pull-up node and the potential of the signal output terminal to be the second potential based on the frame reset signal and the level signal, wherein the potential of the input signal, the potential of the third control signal, the potential of the pull-up node and the potential of the first control signal are the second potential, and the potential of the frame reset signal and the potential of the second control signal are the first potential.

That is, in the fifth period, the potential of the input signal is a low potential, the potential of the pull-up node is a low potential, the potential of the first control signal is a low-potential, the potential of the second control signal is a high potential, the potential of the third control signal is a low potential, the potential of the first pull-down node is a low potential, the potential of the second pull-down node is a high potential, and the potential of the output signal is a low potential.

In step S206, in a sixth period, the first control module controls the potential of the first pull-down node to be the second potential based on the first control signal, the potential of the pull-up node and the level signal; the second control module controls the potential of the second pull-down node to be the first potential based on the second control signal, the potential of the pull-up node and the level signal; the first noise reduction module controls the potential of the pull-up node to be the second potential based on the potential of the first pull-down node, the potential of the second pull-down node and the level signal; and the second noise reduction module controls the potential of the signal output terminal to be the second potential based on the potential of the first pull-down node, the potential of the second pull-down node and the level signal, wherein the potential of the input signal, the potential of the third control signal, the potential of the pull-up node and the potential of the first control signal are the second potential, and the potential of the second control signal is the first potential.

That is, in the sixth period, the potential of the first control signal is a low potential, the potential of the second control signal is a high potential, the potential of the first pull-down node is a low potential, the potential of the second pull-down node is a high potential, and the potential of the output signal is a low potential.

Here, the fourth period may be within the blanking period, and both the fifth period and the sixth period may be within the scanning period.

Figure 11:
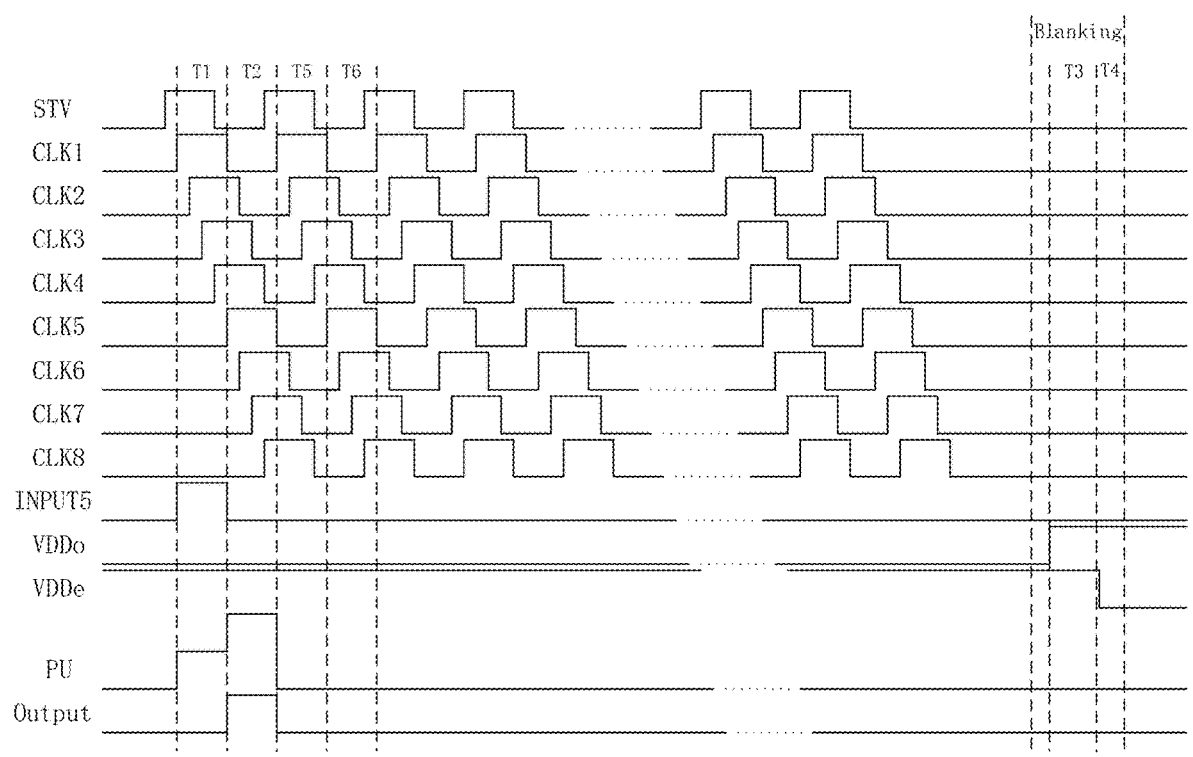
FIG. 11 is a schematic diagram of a timing sequence of a shift register unit according to one or more embodiments of the present disclosure.

The principle of driving the shift register unit in the present disclosure is further described below with reference to FIG. 7. In this embodiment of the present disclosure, Clock 5 is used as the third control signal of the row of shift register units, the level signal terminal VGL continuously inputs low-level signals, and the first potential is a high potential relative to the second potential. FIG. 11 shows a diagram of a timing sequence of signal terminals coupled with a shift register unit.

It can be known from FIG. 11 that, in the first period T1, the potential of an input signal input by the signal input terminal Input 5 is a high potential, that is, the input signal is a high-level signal, the twenty-first transistor M21 is turned on, and the pull-up node PU is pulled up, that is, the potential of the pull-up node PU is a high potential. Correspondingly, the eleventh transistor M11, the twelfth transistor M12, the thirteenth transistor M13, the fourteenth transistor M14 and the twenty-second transistor M22 are turned on. The potential of the third control signal input by the third control signal terminal Clock is a low potential, that is, the third control signal is a low-level signal, and thus the potential of the output signal output to the signal output terminal Output is also a low potential, that is, the output signal is a low-level signal. The potential of the first control signal input by the first control signal terminal VDDo is a low potential, that is, the first control signal is a low-level signal. Correspondingly, the seventh transistor M7 and the eighth transistor M8 are turned off, the potential of the first pull-down node PDo is a low potential, and thus the first transistor M1, the sixteenth transistor M16 and the seventeenth transistor M17 are not turned on. The potential of the second control signal input by the second control signal terminal VDDe is a high potential, that is, the second control signal is a high-level signal, and the ninth transistor M9 and the tenth transistor M10 are turned on. Because both the tenth transistor M10 and the fourteenth transistor M14 are turned on, the potential of the second pull-down node PDe is pulled down to a low potential, and correspondingly, the second transistor M2, the fifteenth transistor M15 and the eighteenth transistor M18 are not turned on.

In the second period T2, because the potential of the input signal is a low potential, the twenty-first transistor M21 is turned off. The potential of the third control signal hops to a high potential. Due to the bootstrap of the capacitor C, the potential of the pull-up node PU rises continuously. The eleventh transistor M11, the twelfth transistor M12, the thirteenth transistor M13, the fourteenth transistor M14 and the twenty-second transistor M22 are turned on. The third control signal at a high potential is transmitted to the signal output terminal Output through the turned-on twenty-second transistor M22, so that the potential of the output signal is also a high potential, that is, the output signal is a high-level signal. Because the potential of the first control signal maintains at the low potential, the seventh transistor M7 and the eighth transistor M8 are kept turned off, and the potential of the first pull-down node PDo is a low potential. Correspondingly, the first transistor M1, the sixteenth transistor M16 and the seventeenth transistor M17 are still not turned on. The potential of the second control signal maintains at the high potential, that is, the second control signal is a high-level signal. Correspondingly, the ninth transistor M9 and the tenth transistor M10 are turned on. However, because both the tenth transistor M10 and the fourteenth transistor M14 are turned on, the second pull-down node PDe is still pulled down to a low potential, and none of the second transistor M2, the fifteenth transistor M15 and the eighteenth transistor M18 is turned on.

In the fifth period T5, because the potential of the input signal maintains as the low potential, the twenty-first transistor M21 is turned off. Because the potential of the frame reset signal input by the frame reset signal terminal Reset is a high potential, that is, the frame reset signal is a high-level signal, the nineteenth transistor M19 and the twentieth transistor M20 are turned on. After the nineteenth transistor M19 is turned on, the pull-up node PU is coupled with the level signal terminal VGL through the nineteenth transistor M19, and the pull-up node PU is pulled down to be at a low potential. All the eleventh transistor M11, the twelfth transistor M12, the thirteenth transistor M13, the fourteenth transistor M14 and the twenty-second transistor M22 are turned off. Additionally, because the twentieth transistor M20 is turned on, the output terminal of the signal output module 4 is coupled with the level signal terminal VGL through the twentieth transistor M20, and the potential of the output signal is pulled down, and the output signal is a low-level signal. In the sixth period T6, the potential of the first control signal maintains at a low-level signal. Therefore, the seventh transistor M7 and the eighth transistor M8 are turned off, the first pull-down node PDo is at a low potential, and the first transistor M1, the sixteenth transistor M16 and the seventeenth transistor M17 are not turned on. The potential of the second control signal maintains at the high potential, and the ninth transistor M9 and the tenth transistor M10 are turned on. Because the tenth transistor M10 is turned on and the fourteenth transistor M14 is turned off, the potential of the second pull-down node PDe is pulled up to a high potential, and thus all the second transistor M2, the fifteenth transistor M15 and the eighteenth transistor M18 are turned on. In this timing sequence, although the second transistor M2 is turned on, both the fourth transistor M4 and the sixth transistor M6 are not turned on because the potential of the first pull-down node PDo is a low potential. Therefore, the total reset module 5 still does not work, and thus the normal output of the shift register unit is not affected. Because the fifteenth transistor M15 is turned on, the pull-up node PU is coupled with the level signal terminal VGL through the fifteenth transistor M15, and the potential of the pull-up node PU is pulled down to be a low potential. Because the eighteenth transistor M18 is turned on, the output terminal of the signal output module 4 is coupled with the level signal terminal VGL through the eighteenth transistor M18, and the potential of the output signal is pulled down, and the output signal is a low-level signal.

In the sixth period T6, because the potential of the frame reset signal input by the frame reset signal terminal Reset is a low potential, both the nineteenth transistor M19 and the twentieth transistor M20 are turned off. The potentials of the first control signal, the second control signal and the third control signal are the same as those in the third period, and the working status of other transistors are the same as that in the third period. That is, in the sixth period T6, the potential of the input signal is a low potential, the potential of the first control signal is a low potential, and the potential of the first pull-down node PDo is a low potential. The potential of the second control signal is a high potential, and the potential of the second pull-down node PDe is a high potential. In this case, the pull-up node PU is coupled with the level signal terminal VGL through the fifteenth transistor M15, and the potential of the pull-up node PU is pulled down to a low potential, the output terminal of the signal output module 4 is coupled with the level signal terminal VGL through the eighteenth transistor M18. Thus, the potential of the output signal is pulled down.

The sixth period T6 may be as long as the fifth period T5, or may last until the end of the scanning period. In the sixth period, the signal input terminal Input 5 continuously inputs low-level input signals, the first control signal terminal VDDo continuously inputs low-level first control signals, the second control signal terminal VDDe continuously inputs low-level second control signals, and the signal output module 4 continuously outputs low-level output signals.

In the third period T3, when the blanking period starts, and both the potential of the first control signal and the potential of the second control signal are high-level signals, all the seventh transistor M7, the eighth transistor M8, the ninth transistor M9 and the tenth transistor M10 are turned on. Because the pull-up node PU is always at a low potential, the eleventh transistor M11, the twelfth transistor M12, the thirteenth transistor M13 and the fourteenth transistor M14 are turned off, and thus the potential of the first pull-down node PDo and the potential of the second pull-down node PDe are pulled up to be high potentials. Therefore, both the first transistor M1 and the second transistor M2 are turned on, and the third transistor M3, the fourth transistor M4, the fifth transistor M5 and the sixth transistor M6 are controlled to be turned on. The pull-up node PU is coupled with the level signal terminal VGL through the fourth transistor M4 and the fifth transistor M5, and the output terminal of the signal output module 4 is coupled with the level signal terminal VGL through the third transistor M3 and the sixth transistor M6, such that both the potential of pull-up node PU and the potential of the output signal are pulled down. In addition, the fifteenth transistor M15, the sixteenth transistor M16, the seventeenth transistor M17 and the eighteenth transistor M18 are also turned on, which further pulls down the potential of the pull-up node PU and the potential of the output signal.

In the fourth period T4, the potential of the first control signal and the potential of the second control signal are reversed, that is, the potential of the first control signal is a high-level signal, and the potential of the second control signal is a low-level signal. In this case, the seventh transistor M7 and the eighth transistor M8 are turned on, and the ninth transistor M9 and the tenth transistor M10 are turned off. The potential of the first pull-down node PDo is a high potential, and the first transistor M1, the sixteenth transistor M16 and the seventeenth transistor M17 are turned on. The potential of the second pull-down node PDe is a low potential, so that the second transistor M2, the third transistor M3 and the fifth transistor M5 are not turned on, and thus the total reset module 5 is not turned on. In addition, because the sixteenth transistor M16 and the seventeenth transistor M17 are turned on, the potential of the pull-up node PU and the potential of the output signal can be pulled down continuously. Because the potential of the second pull-down node PDe is a low potential, the fifteenth transistor M15 and the eighteenth transistor M18 are not turned on.

It can be known from the foregoing embodiments that, in the shift register unit provided in the present disclosure, the total reset function can be implemented without the need to dispose an additional total reset module in the circuit of the shift register unit to provide a total reset signal. The total reset function of the circuit can be implemented merely based on the circuit design of the shift register unit and adjustment of signal timing, by using the timing sequences of the first control signal and the second control signal which are both at the operating potential during potential alternation in the blanking period in the blanking period of one frame signal. For a GOA circuit which does not support a total reset signal during the level shift, total reset in each row can also be achieved, to avoid charge residue and signal residue caused by insufficient reset of cascaded signals input by a frame reset signal terminal. Therefore, the shift register unit can be turned off normally in this frame, without affecting display of the next frame of image.

One or more embodiments of the present disclosure further provide a gate drive circuit. The gate drive circuit includes at least two cascaded shift register units in any one of the foregoing embodiments.

Here, the signal input terminal of an $N^{th}$ stage of shift register unit of the gate drive circuit is coupled with the signal output terminal of an $(N-k)^{th}$ stage of shift register unit, and configured to receive an input signal output by the signal output terminal of the $(N-k)^{th}$ stage of shift register unit. The frame reset module of the $N^{th}$ stage of shift register unit is coupled with the signal output terminal of an $(N+k)^{th}$ stage of shift register unit, and configured to receive a frame reset signal output by the signal output terminal of the $(N+k)^{th}$ stage of shift register unit.

N is the number of the shift register units in the gate drive circuit, and N is an integer greater than k. k is an integer greater than or equal to 1 and less than or equal to N.

Figure 12:
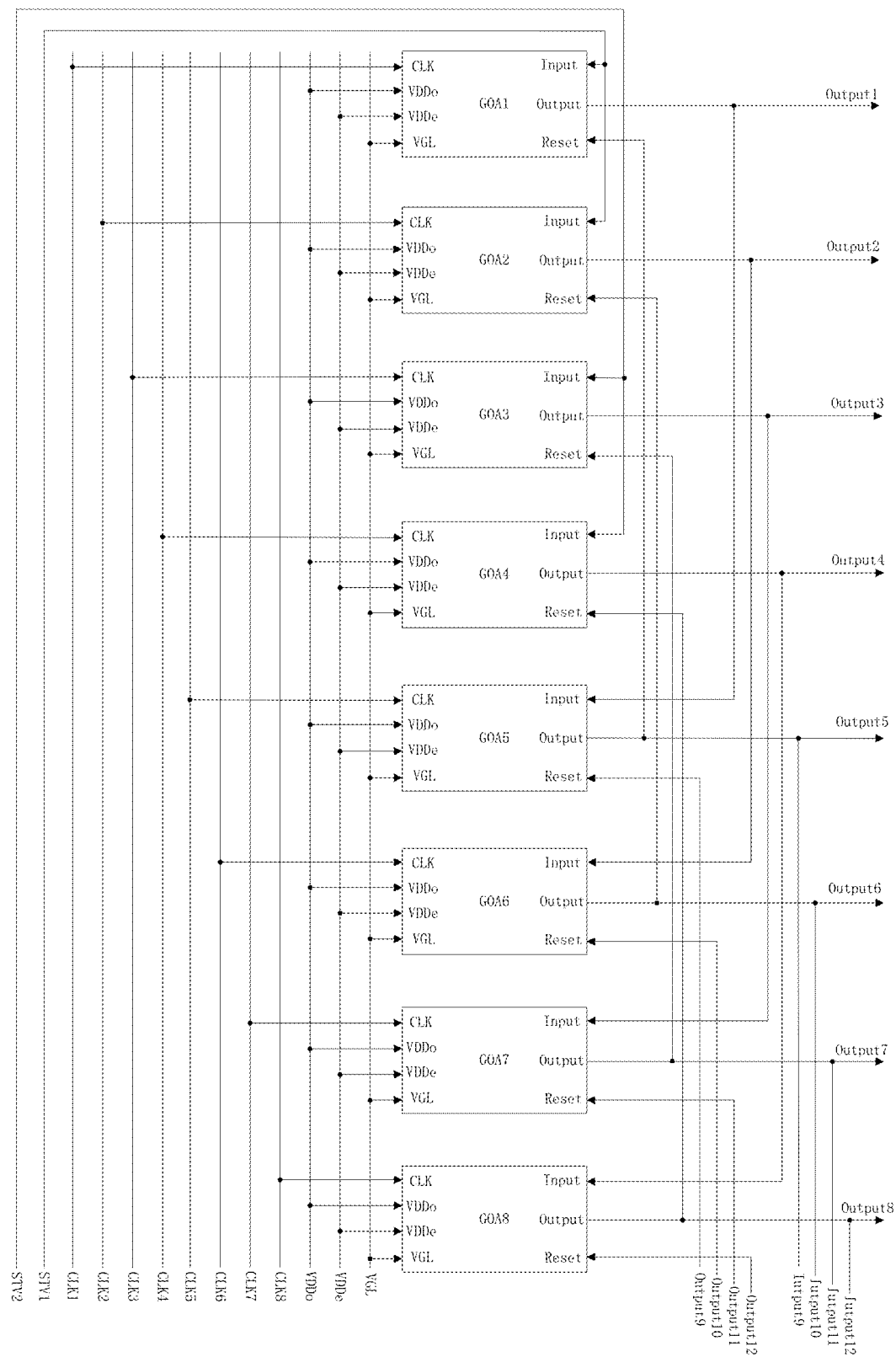
FIG. 12 is a schematic diagram of a cascaded structure of a gate drive circuit according to one or more embodiments of the present disclosure.

FIG. 12 shows a specific implementation of the gate drive circuit in an embodiment of the present disclosure. In this embodiment of the present disclosure, k=4. That is, the signal input terminal of the $N^{th}$ stage of shift register unit is coupled with the signal output terminal of an $(N-4)^{th}$ stage of shift register unit, and the frame reset module of the $N^{th}$ stage of shift register unit is coupled with the signal output terminal of an $(N+k)^{th}$ stage of shift register unit.

It can be known from the foregoing embodiments that, in the gate drive circuit provided in the present disclosure can implement the total reset function by itself due to the structural design of the total reset module and the timing sequence design of the first control signal and the second control signal in the blanking period. Therefore, the gate drive circuit is applicable to all level shifts, not matter whether a total reset signal exists in the level shift. Therefore, the limitation of IC selection is eliminated.

Figure 13:
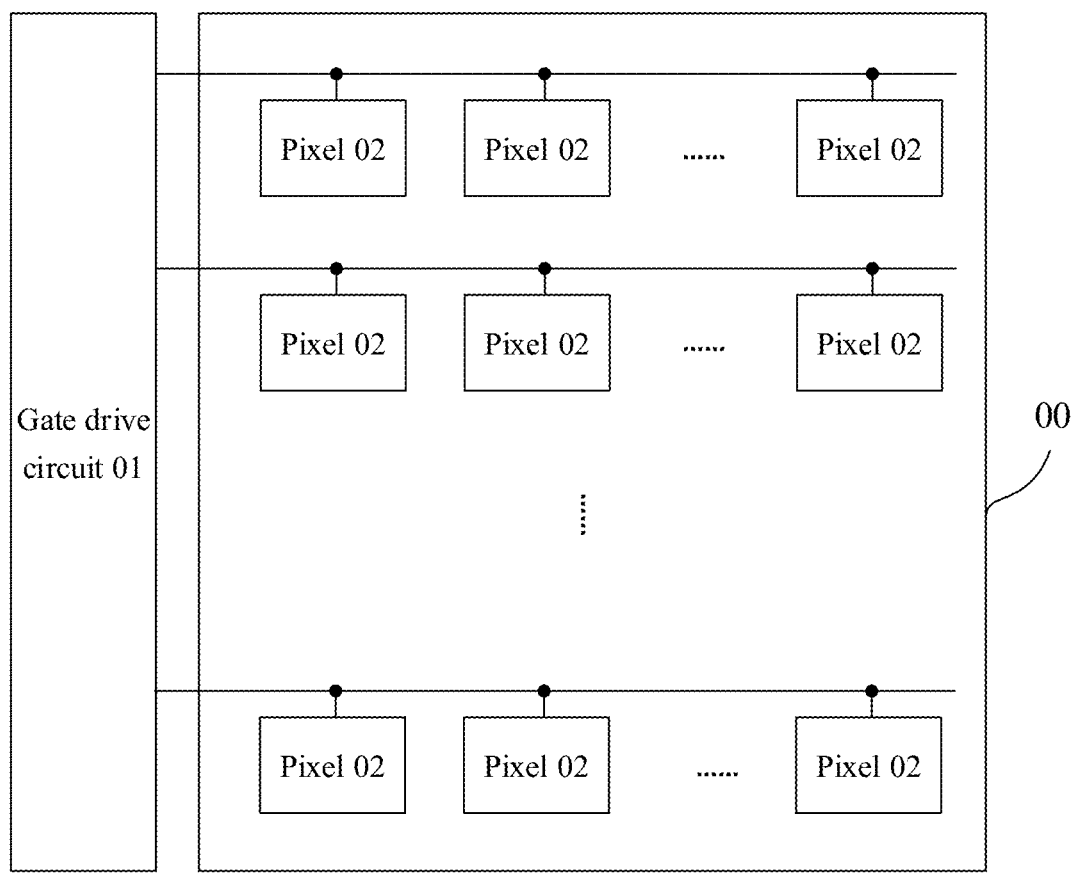
FIG. 13 is a schematic structural diagram of an array substrate according to one or more embodiments of the present disclosure.

One or more embodiments of the present disclosure further provide an array substrate. Referring to FIG. 13, the array substrate may include a base substrate 00 and the gate drive circuit 01 described in the foregoing embodiment.

The base substrate 00 is provided with a plurality of pixels 02. The gate drive circuit 01 may be coupled with the plurality of pixels 02, and configured to provide gate drive signals to the plurality of pixels 02.

It can be known from the foregoing embodiments that, in the substrate provided in the present disclosure, the gate drive circuit can implement the total reset function by itself due to the structural design of the total reset module and the timing sequence design of the first control signal and the second control signal in the blanking period. Therefore, the gate drive circuit is applicable to all level shifts, not matter whether a total reset signal exists in the level shift. Therefore, the limitation of IC selection is eliminated.

Figure 14:
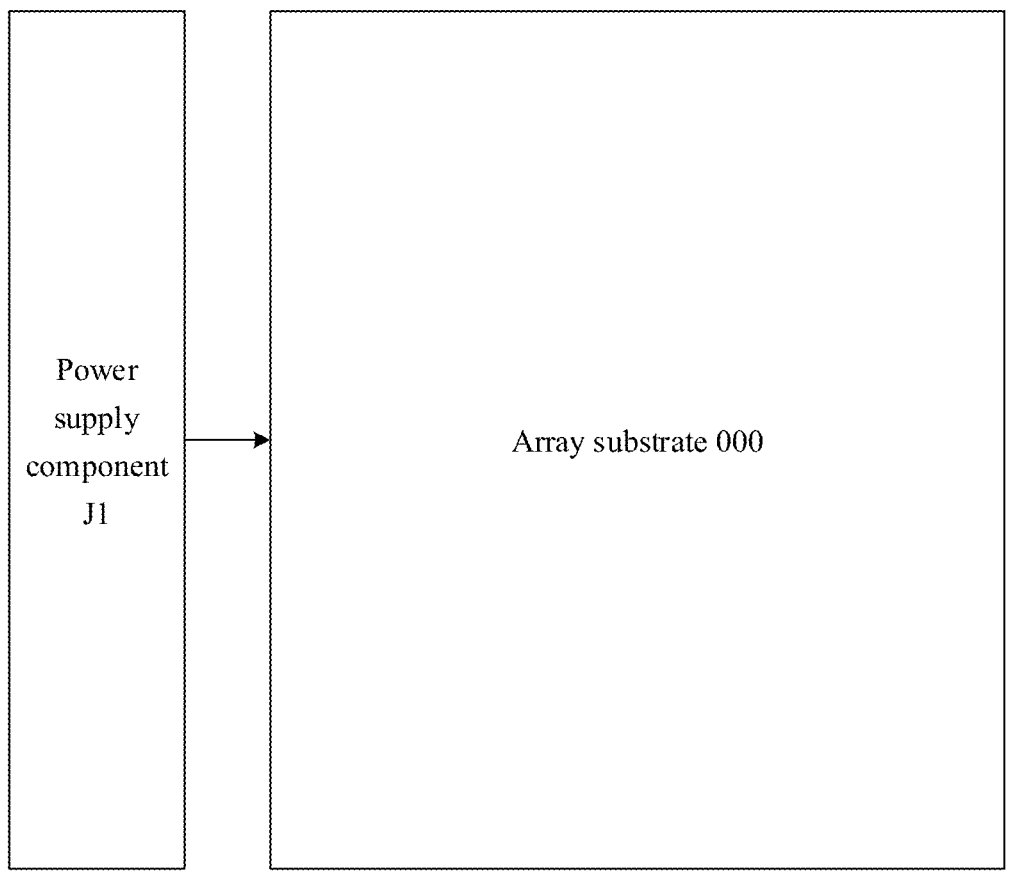
FIG. 14 is a schematic structural diagram of a display device according to one or more embodiments of the present disclosure.

One or more embodiments of the present disclosure further provide a display device. Referring to FIG. 14, the display device may include a power supply component J1 and the array substrate 000 described in the foregoing embodiment. The power supply component J1 is coupled with the array substrate 000, and the power supply component J1 is configured to supply power to the array substrate 000.

It can be known from the foregoing embodiments that, in the display device provided in the present disclosure, the gate drive circuit can implement the total reset function by itself due to the structural design of the total reset module and the timing sequence design of the first control signal and the second control signal in the blanking period. Therefore, the gate drive circuit is applicable to all level shifts, not matter whether a total reset signal exists in the level shift. Therefore, the limitation of IC selection is eliminated.

Those of ordinary skill in the art should understand that the discussion of any of the above embodiments is only exemplary, and is not intended to imply that the scope of the present disclosure (including the claims) is limited to these examples. With the idea of the present disclosure, the above embodiments or the technical features in different embodiments may also be combined, and the steps may be performed in any order. Additionally, there may be other changes in different aspects of one or more embodiments of the present disclosure as described above, which are not elaborated for brevity.

In addition, in order to simplify the descriptions and discussion, and in order to make one or more embodiments of the present disclosure easy to understand, the coupling between the components in the present disclosure and the integrated circuit (IC) chips or other components, such as the well-known power supply/ground may not be shown in the figures. In addition, to prevent one or more embodiments of the present disclosure being understood with difficulty, the device may be shown in a block diagram, which is also made with consideration of the fact that the details of the implementation of the device in the block diagram are highly dependent on the platform on which one or more embodiments of the present disclosure are to be implemented (that is, the details should be fully within the scope to be understood by those skilled in the art). In the case where specific details (for example, circuits) are elaborated to illustrate exemplary embodiments of the present disclosure, it is obvious to those skilled in the art that one or more embodiments of the present disclosure can be implemented without these specific details or when the specific details change. Therefore, these descriptions should be construed as illustrative rather than restrictive.

Although the present disclosure has been described in conjunction with specific embodiments of the present disclosure, various substitutions, modifications and variations of these embodiments are apparent to those of ordinary skill in the art based on the above descriptions. For example, other memories (e.g., dynamic RAM (DRAM)) may adopt the discussed embodiments.

The one or more embodiments of the present disclosure are intended to cover all substitutions, modifications, and variations that fall within the broad scope of the appended claims. Therefore, any omissions, modifications, equivalent substitutions, improvements and the like made within the spirit and principle of the one or more embodiments of the present disclosure shall be included in the protection scope of the present disclosure.

What is claimed is:

1. A shift register unit, comprising:
a signal input module, configured to charge a pull-up node based on an input signal;
a first control module, configured to control a potential of a first pull-down node based on a first control signal, a potential of the pull-up node and a level signal;
a second control module, configured to control a potential of a second pull-down node based on a second control signal, the potential of the pull-up node and the level signal;
a signal output module, configured to output an output signal to a signal output terminal based on the potential of the pull-up node and a third control signal; and
a total reset module, configured to control the potential of the pull-up node and a potential of the signal output terminal based on the potential of the first pull-down node, the potential of the second pull-down node and the level signal,
wherein in a scanning period, a potential of the first control signal or a potential of the second control signal is an operating potential; and in at least part of a blanking period, both the potential of the first control signal and the potential of the second control signal are the operating potential,
wherein the total reset module comprises a first transistor, a second transistor, a third transistor and a fourth transistor, wherein
a gate of the first transistor is coupled with the first pull-down node, a first electrode of the first transistor is coupled with the second pull-down node, and a second electrode of the first transistor is coupled with a gate of the third transistor; a first electrode of the third transistor is coupled with the signal output terminal, and a second electrode of the third transistor is configured to receive the level signal; and
a gate of the second transistor is coupled with the second pull-down node, a first electrode of the second transistor is coupled with the first pull-down node, and a second electrode of the second transistor is coupled with a gate of the fourth transistor; a first electrode of the fourth transistor is coupled with the pull-up node, and a second electrode of the fourth transistor is configured to receive the level signal.

2. The shift register unit according to claim 1, wherein the total reset module further comprises a fifth transistor and a sixth transistor, wherein
a gate of the fifth transistor is coupled with the second electrode of the first transistor, a first electrode of the fifth transistor is coupled with the pull-up node, and a second electrode of the fifth transistor is configured to receive the level signal; and
a gate of the sixth transistor is coupled with the second electrode of the second transistor, a first electrode of the sixth transistor is coupled with the signal output terminal, and a second electrode of the sixth transistor is configured to receive the level signal.

3. The shift register unit according to claim 1, wherein the first control module comprises a seventh transistor, an eighth transistor, an eleventh transistor and a twelfth transistor, wherein
a gate and a first electrode of the seventh transistor are configured to receive the first control signal, and a second electrode of the seventh transistor is coupled with a first electrode of the twelfth transistor; a gate of the twelfth transistor is coupled with the pull-up node, and a second electrode of the twelfth transistor is configured to receive the level signal;

a gate of the eighth transistor is coupled with the second electrode of the seventh transistor, a first electrode of the eighth transistor is configured to receive the first control signal, and a second electrode of the eighth transistor is coupled with the first pull-down node; and a gate of the eleventh transistor is coupled with the pull-up node, a first electrode of the eleventh transistor is coupled with the first pull-down node, and a second electrode of the eleventh transistor is configured to receive the level signal.

4. The shift register unit according to claim 1, wherein the second control module comprises a ninth transistor, a tenth transistor, a thirteenth transistor and a fourteenth transistor, wherein a gate and a first electrode of the ninth transistor are configured to receive the second control signal, and a second electrode of the ninth transistor is coupled with a first electrode of the thirteenth transistor; a gate of the thirteenth transistor is coupled with the pull-up node, and a second electrode of the thirteenth transistor is configured to receive the level signal;

a gate of the tenth transistor is coupled with the second electrode of the ninth transistor, a first electrode of the tenth transistor is configured to receive the second control signal, and a second electrode of the tenth transistor is coupled with the second pull-down node; and a gate of the fourteenth transistor is coupled with the pull-up node, a first electrode of the fourteenth transistor is coupled with the second pull-down node, and a second electrode of the fourteenth transistor is configured to receive the level signal.

5. The shift register unit according to claim 1, further comprising:

a first noise reduction module, configured to control the potential of the pull-up node based on the potential of the first pull-down node, the potential of the second pull-down node and the level signal; and a second noise reduction module, configured to control the potential of the signal output terminal based on the potential of the first pull-down node, the potential of the second pull-down node and the level signal.

6. The shift register unit according to claim 5, wherein the first noise reduction module comprises a fifteenth transistor and a sixteenth transistor, wherein a gate of the fifteenth transistor is coupled with the second pull-down node, a first electrode of the fifteenth transistor is coupled with the pull-up node, and a second electrode of the fifteenth transistor is configured to receive the level signal; and a gate of the sixteenth transistor is coupled with the first pull-down node, a first electrode of the sixteenth transistor is coupled with the pull-up node, and a second electrode of the sixteenth transistor is configured to receive the level signal.

7. The shift register unit according to claim 5, wherein the second noise reduction module comprises a seventeenth transistor and an eighteenth transistor, wherein a gate of the seventeenth transistor is coupled with the first pull-down node, a first electrode of the seventeenth transistor is coupled with the signal output terminal, and a second electrode of the seventeenth transistor is configured to receive the level signal; and a gate of the eighteenth transistor is coupled with the second pull-down node, a first electrode of the eighteenth transistor is coupled with the signal output terminal, and a second electrode of the eighteenth transistor is configured to receive the level signal.

8. The shift register unit according to claim 7, further comprising: a frame reset module, configured to control the potential of the pull-up node and the potential of the signal output terminal based on a frame reset signal and the level signal, wherein the total reset module comprises a first transistor, a second transistor, a third transistor, a fourth transistor, a fifth transistor and a sixth transistor; the first control module comprises a seventh transistor, an eighth transistor, an eleventh transistor and a twelfth transistor; the second control module comprises a ninth transistor, a tenth transistor, a thirteenth transistor and a fourteenth transistor; the first noise reduction module comprises a fifteenth transistor and a sixteenth transistor; the frame reset module comprises a nineteenth transistor and a twentieth transistor; the signal input module comprises a twenty-first transistor; and the signal output module comprises a twenty-second transistor and a capacitor, wherein a gate of the first transistor is coupled with the first pull-down node, a first electrode of the first transistor is coupled with the second pull-down node, and a second electrode of the first transistor is coupled with a gate of the third transistor; a first electrode of the third transistor is coupled with the signal output terminal, and a second electrode of the third transistor is configured to receive the level signal;

a gate of the second transistor is coupled with the second pull-down node, a first electrode of the second transistor is coupled with the first pull-down node, and a second electrode of the second transistor is coupled with a gate of the fourth transistor; a first electrode of the fourth transistor is coupled with the pull-up node, and a second electrode of the fourth transistor is configured to receive the level signal;

a gate of the fifth transistor is coupled with the second electrode of the first transistor, a first electrode of the fifth transistor is coupled with the pull-up node, and a second electrode of the fifth transistor is configured to receive the level signal;

a gate of the sixth transistor is coupled with the second electrode of the second transistor, a first electrode of the sixth transistor is coupled with the signal output terminal, and a second electrode of the sixth transistor is configured to receive the level signal;

a gate and a first electrode of the seventh transistor are configured to receive the first control signal, and a second electrode of the seventh transistor is coupled with a first electrode of the twelfth transistor; a gate of the twelfth transistor is coupled with the pull-up node, and a second electrode of the twelfth transistor is configured to receive the level signal;

a gate of the eighth transistor is coupled with the second electrode of the seventh transistor, a first electrode of the eighth transistor is configured to receive the first control signal, and a second electrode of the eighth transistor is coupled with the first pull-down node;

a gate of the eleventh transistor is coupled with the pull-up node, a first electrode of the eleventh transistor is coupled with the first pull-down node, and a second electrode of the eleventh transistor is configured to receive the level signal;

a gate and a first electrode of the ninth transistor are configured to receive the second control signal, and a second electrode of the ninth transistor is coupled with a first electrode of the thirteenth transistor; a gate of the thirteenth transistor is coupled with the pull-up node, and a second electrode of the thirteenth transistor is configured to receive the level signal;

a gate of the tenth transistor is coupled with the second electrode of the ninth transistor, a first electrode of the tenth transistor is configured to receive the second control signal, and a second electrode of the tenth transistor is coupled with the second pull-down node;

a gate of the fourteenth transistor is coupled with the pull-up node, a first electrode of the fourteenth transistor is coupled with the second pull-down node, and a second electrode of the fourteenth transistor is configured to receive the level signal;

a gate of the fifteenth transistor is coupled with the second pull-down node, a first electrode of the fifteenth transistor is coupled with the pull-up node, and a second electrode of the fifteenth transistor is configured to receive the level signal;

a gate of the sixteenth transistor is coupled with the first pull-down node, a first electrode of the sixteenth transistor is coupled with the pull-up node, and a second electrode of the sixteenth transistor is configured to receive the level signal;

a gate of the nineteenth transistor is configured to receive the frame reset signal, a first electrode of the nineteenth transistor is coupled with the pull-up node, and a second electrode of the nineteenth transistor is configured to receive the level signal;

a gate of the twentieth transistor is configured to receive the frame reset signal, a first electrode of the twentieth transistor is coupled with the signal output terminal, and a second electrode of the twentieth transistor is configured to receive the level signal;

a gate and a first electrode of the twenty-first transistor are configured to receive the input signal, and a second electrode of the twenty-first transistor is coupled with the pull-up node;

a gate of the twenty-second transistor is coupled with the pull-up node, a first electrode of the twenty-second transistor is configured to receive the third control signal, and a second electrode of the twenty-second transistor is coupled with the signal output terminal; and one terminal of the capacitor is coupled with the pull-up node, and the other terminal of the capacitor is coupled with the second electrode of the twenty-second transistor;

wherein each transistor in the shift register unit comprises at least one of a polysilicon thin film transistor, an amorphous-silicon thin film transistor, an oxide thin film transistor and an organic thin film transistor.

9. The shift register unit according to claim 1, further comprising:

a frame reset module, configured to control the potential of the pull-up node and the potential of the signal output terminal based on a frame reset signal and the level signal.

10. The shift register unit according to claim 9, wherein the frame reset module comprises a nineteenth transistor and a twentieth transistor, wherein a gate of the nineteenth transistor is configured to receive the frame reset signal, a first electrode of the nineteenth transistor is coupled with the pull-up node, and a second electrode of the nineteenth transistor is configured to receive the level signal; and a gate of the twentieth transistor is configured to receive the frame reset signal, a first electrode of the twentieth transistor is coupled with the signal output terminal, and a second electrode of the twentieth transistor is configured to receive the level signal.

11. The shift register unit according to claim 1, wherein the signal input module comprises a twenty-first transistor, wherein a gate and a first electrode of the twenty-first transistor are configured to receive the input signal, and a second electrode of the twenty-first transistor is coupled with the pull-up node.

12. The shift register unit according to claim 1, wherein the signal output module comprises a twenty-second transistor and a capacitor, wherein a gate of the twenty-second transistor is coupled with the pull-up node, a first electrode of the twenty-second transistor is configured to receive the third control signal, and a second electrode of the twenty-second transistor is coupled with the signal output terminal; and one terminal of the capacitor is coupled with the pull-up node, and the other terminal of the capacitor is coupled with the second electrode of the twenty-second transistor.

13. The shift register unit according to claim 1, wherein each transistor in the shift register unit comprises at least one of a polysilicon thin film transistor, an amorphous-silicon thin film transistor, an oxide thin film transistor and an organic thin film transistor.

14. A method for driving a shift register unit, applicable to drive a shift register unit, wherein the shift register unit comprises a signal input module, a first control module, a second control module, a signal output module and a total reset module, the method comprising:

in a first period, controlling, by the signal input module, a potential of a pull-up node to be a first potential based on an input signal, to charge the pull-up node; controlling, by the first control module, a potential of a first pull-down node to be a second potential based on a first control signal, the potential of the pull-up node and a level signal; controlling, by the second control module, a potential of a second pull-down node to be the second potential based on a second control signal, the potential of the pull-up node and the level signal, wherein a potential of the input signal and a potential of the second control signal are the first potential, a potential of the first control signal is the second potential, and a potential of the level signal is the second potential, the first potential being an operating potential, and the second potential being a non-operating potential; and in a second period, outputting, by the signal output module, an output signal at the first potential to a signal output terminal based on the potential of the pull-up node and a third control signal; controlling, by the first control module, the potential of the first pull-down node to be the second potential based on the first control signal, the potential of the pull-up node and the level signal; and controlling, by the second control module, the potential of the second pull-down node to be the second potential based on the second control signal, the potential of the pull-up node and the level signal, wherein the potential of the second control signal, the potential of the pull-up node and a potential of the third control signal are the first potential, and the potential of the first control signal and the potential of the input signal are the second potential; and in a third period, controlling, by the first control module, the potential of the first pull-down node to be the first potential based on the first control signal, the potential of the pull-up node and the level signal; controlling, by the second control module, the potential of the second pull-down node to be the first potential based on the second control signal, the potential of the pull-up node and the level signal; and controlling, by the total reset module, the potential of the pull-up node and a potential of the signal output terminal to be the second potential based on the potential of the first pull-up node, the potential of the second pull-down node and the level signal, wherein the potential of the input signal, the potential of the third control signal and the potential of the pull-up node are the second potential, and the potential of the first control signal and the potential of the second control signal are the first potential, wherein both the first period and the second period are within a scanning period, and the third period is within a blanking period, wherein the total reset module comprises a first transistor, a second transistor, a third transistor and a fourth transistor, wherein a gate of the first transistor is coupled with the first pull-down node, a first electrode of the first transistor is coupled with the second pull-down node, and a second electrode of the first transistor is coupled with a gate of the third transistor; a first electrode of the third transistor is coupled with the signal output terminal, and a second electrode of the third transistor is configured to receive the level signal; and a gate of the second transistor is coupled with the second pull-down node, a first electrode of the second transistor is coupled with the first pull-down node, and a second electrode of the second transistor is coupled with a gate of the fourth transistor; a first electrode of the fourth transistor is coupled with the pull-up node, and a second electrode of the fourth transistor is configured to receive the level signal.

15. The method according to claim 14, wherein after the third period, the method further comprises:

in a fourth period, controlling, by the first control module, the potential of the first pull-down node to be the first potential based on the first control signal, the potential of the pull-up node and the level signal; and controlling, by the second control module, the potential of the second pull-down node to be the second potential based on the second control signal, the potential of the pull-up node and the level signal, wherein the potential of the input signal, the potential of the third control signal, the potential of the pull-up node and the potential of the second control signal are the second potential, and the potential of the first control signal is the first potential, wherein the fourth period is within the blanking period.

16. The method according to claim 14, wherein the shift register unit further comprises a frame reset module, a first noise reduction module and a second noise reduction module; and between the second period and the third period, the method further comprises:

in a fifth period, controlling, by the first control module, the potential of the first pull-down node to be the second potential based on the first control signal, the potential of the pull-up node and the level signal; controlling, by the second control module, the potential of the second pull-down node to be the first potential based on the second control signal, the potential of the pull-up node and the level signal; controlling, by the first noise reduction module, the potential of the pull-up node to be the second potential based on the potential of the first pull-down node, the potential of the second pull-down node and the level signal; controlling, by the second noise reduction module, the potential of the signal output terminal to be the second potential based on the potential of the first pull-down node, the potential of the second pull-down node and the level signal; and controlling, by the frame reset module, both the potential of the pull-up node and the potential of the signal output terminal to be the second potential based on a frame reset signal and the level signal, wherein the potential of the input signal, the potential of the third control signal, the potential of the pull-up node and the potential of the first control signal are all the second potential, and a potential of the frame reset signal and the potential of the second control signal are the first potential; and in a sixth period, controlling, by the first control module, the potential of the first pull-down node to be the second potential based on the first control signal, the potential of the pull-up node and the level signal; controlling, by the second control module, the potential of the second pull-down node to be the first potential based on the second control signal, the potential of the pull-up node and the level signal; controlling, by the first noise reduction module, the potential of the pull-up node to be the second potential based on the potential of the first pull-down node, the potential of the second pull-down node and the level signal; and controlling, by the second noise reduction module, the potential of the signal output terminal to be the second potential based on the potential of the first pull-down node, the potential of the second pull-down node and the level signal, wherein the potential of the input signal, the potential of the third control signal, the potential of the pull-up node and the potential of the first control signal are the second potential, and the potential of the second control signal is the first potential, wherein the fifth period and the sixth period are within the scanning period.

17. A gate drive circuit, comprising at least two cascaded shift register units, wherein the shift register unit comprises a signal input module, a first control module, a second control module, a signal output module and a total reset module, wherein an $N^{th}$ stage of shift register unit is configured to receive an input signal output from a signal output terminal of an $(N-k)^{th}$ stage of shift register unit, and the $N^{th}$ stage of shift register unit is configured to receive a frame reset signal output from a signal output terminal of an $(N+k)^{th}$ stage of shift register unit, wherein N is a number of the shift register units in the gate drive circuit, and k is an integer less than or equal to N, the signal input module is configured to charge a pull-up node based on the input signal;

the first control module is configured to control a potential of a first pull-down node based on a first control signal, a potential of the pull-up node and a level signal;

the second control module is configured to control a potential of a second pull-down node based on a second control signal, the potential of the pull-up node and the level signal;

the signal output module is configured to output an output signal to a signal output terminal based on the potential of the pull-up node and a third control signal; and the total reset module is configured to control the potential of the pull-up node and a potential of the signal output terminal based on the potential of the first pull-down node, the potential of the second pull-down node and the level signal, wherein in a scanning period, a potential of the first control signal or a potential of the second control signal is an operating potential; and in at least part of a blanking period, both the potential of the first control signal and the potential of the second control signal are the operating potential, wherein the total reset module comprises a first transistor, a second transistor, a third transistor and a fourth transistor, wherein a gate of the first transistor is coupled with the first pull-down node, a first electrode of the first transistor is coupled with the second pull-down node, and a second electrode of the first transistor is coupled with a gate of the third transistor; a first electrode of the third transistor is coupled with the signal output terminal, and a second electrode of the third transistor is configured to receive the level signal; and a gate of the second transistor is coupled with the second pull-down node, a first electrode of the second transistor is coupled with the first pull-down node, and a second electrode of the second transistor is coupled with a gate of the fourth transistor; a first electrode of the fourth transistor is coupled with the pull-up node, and a second electrode of the fourth transistor is configured to receive the level signal.

18. An array substrate, comprising a base substrate and the gate drive circuit according to claim 17, wherein
the base substrate is provided with a plurality of pixels, the gate drive circuit is coupled with the plurality of pixels, and the gate drive circuit is configured to provide a gate drive signal to the plurality of pixels.

19. A display device, comprising a power supply component and the array substrate according to claim 18, wherein
the power supply component is coupled with the array substrate, and the power supply component is configured to supply power to the array substrate.

* * * * *